US011101382B1

(12) United States Patent
Ankoudinov et al.

(10) Patent No.: US 11,101,382 B1
(45) Date of Patent: Aug. 24, 2021

(54) PROCESS AND STRUCTURE FOR A SUPERJUNCTION DEVICE

(71) Applicant: Power Integrations, Inc., San Jose, CA (US)

(72) Inventors: Alexei Ankoudinov, San Jose, CA (US); Sorin S. Georgescu, Gilroy, CA (US)

(73) Assignee: POWER INTEGRATIONS, INC., San Jose, CA (US)

( * ) Notice: Subject to any disclaimer, the term of this patent is extended or adjusted under 35 U.S.C. 154(b) by 0 days.

(21) Appl. No.: 16/778,904

(22) Filed: Jan. 31, 2020

(51) Int. Cl.
*H01L 21/00* (2006.01)
*H01L 29/78* (2006.01)
*H01L 21/425* (2006.01)
*H01L 29/06* (2006.01)
*H01L 29/66* (2006.01)

(52) U.S. Cl.
CPC .......... *H01L 29/781* (2013.01); *H01L 21/425* (2013.01); *H01L 29/0634* (2013.01); *H01L 29/66712* (2013.01)

(58) Field of Classification Search
CPC . H01L 29/781; H01L 21/425; H01L 29/0634; H01L 29/66712
See application file for complete search history.

(56) References Cited

U.S. PATENT DOCUMENTS

| 7,052,982 B2 | 5/2006 | Hshieh et al. |
| 7,345,342 B2 * | 3/2008 | Challa ................. H01L 29/0634 257/341 |
| 7,465,986 B2 * | 12/2008 | Girdhar ................ H01L 29/407 257/330 |
| 8,765,609 B2 * | 7/2014 | Parthasarathy ....... H01L 29/407 438/701 |

* cited by examiner

*Primary Examiner* — Richard A Booth
(74) *Attorney, Agent, or Firm* — Power Integrations, Inc.

(57) ABSTRACT

A superjunction device comprising a drain contact, a substrate layer above the drain contact, an epitaxial layer above the substrate layer, a P+ layer above the epitaxial layer formed by P-type implantation to a bottom of the superjunction device, a trench with a sloped angle formed by use of a hard mask layer. The trench is filled with an insulating material. A first vertical column is formed adjacent to the trench. A second vertical column is formed adjacent to the first vertical column. A source contact is coupled to the first vertical column and the second vertical column. A P-body region is coupled to the source contact. A gate oxide is formed above the source contact and the epitaxial layer, and a gate formed above the gate oxide.

21 Claims, 22 Drawing Sheets

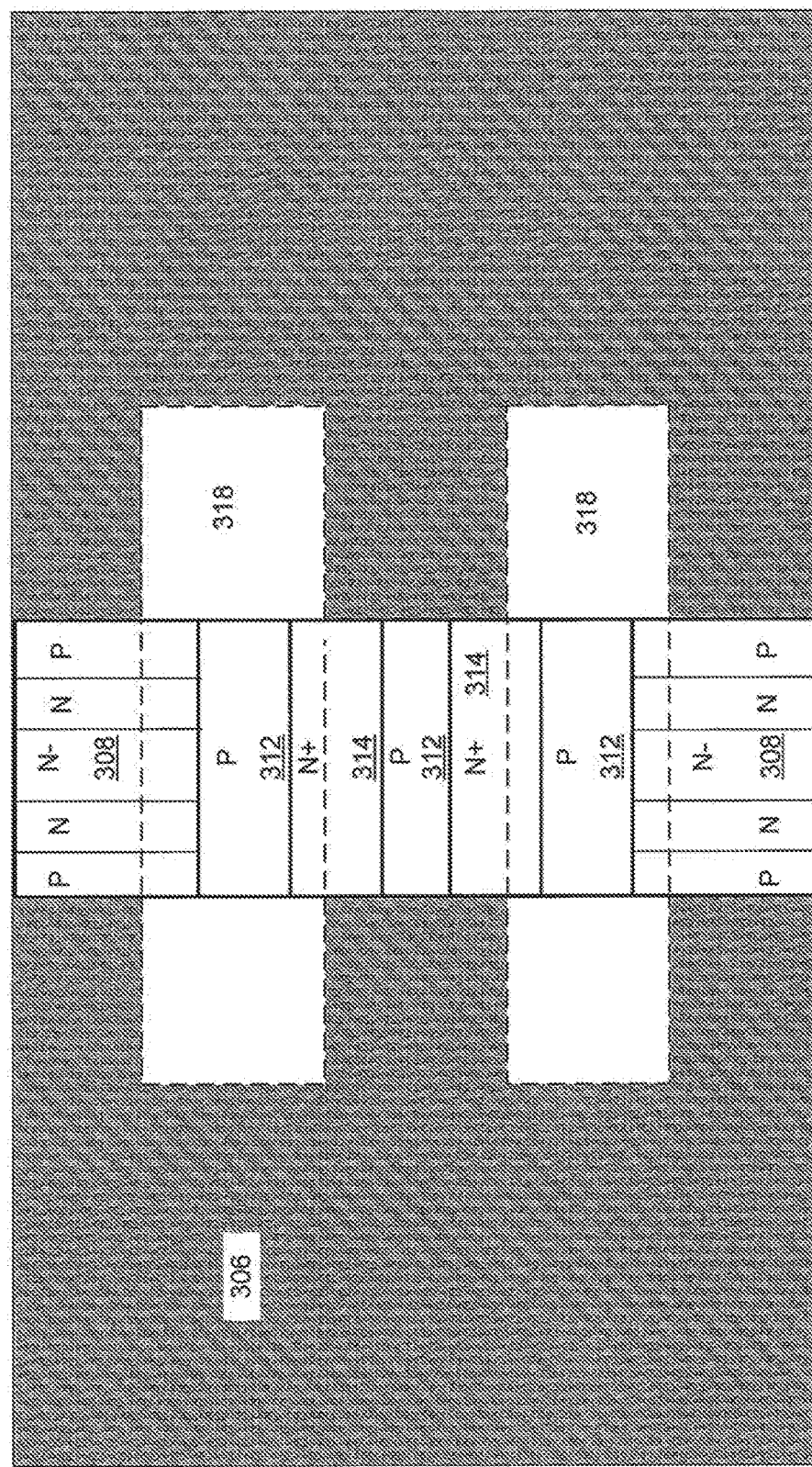

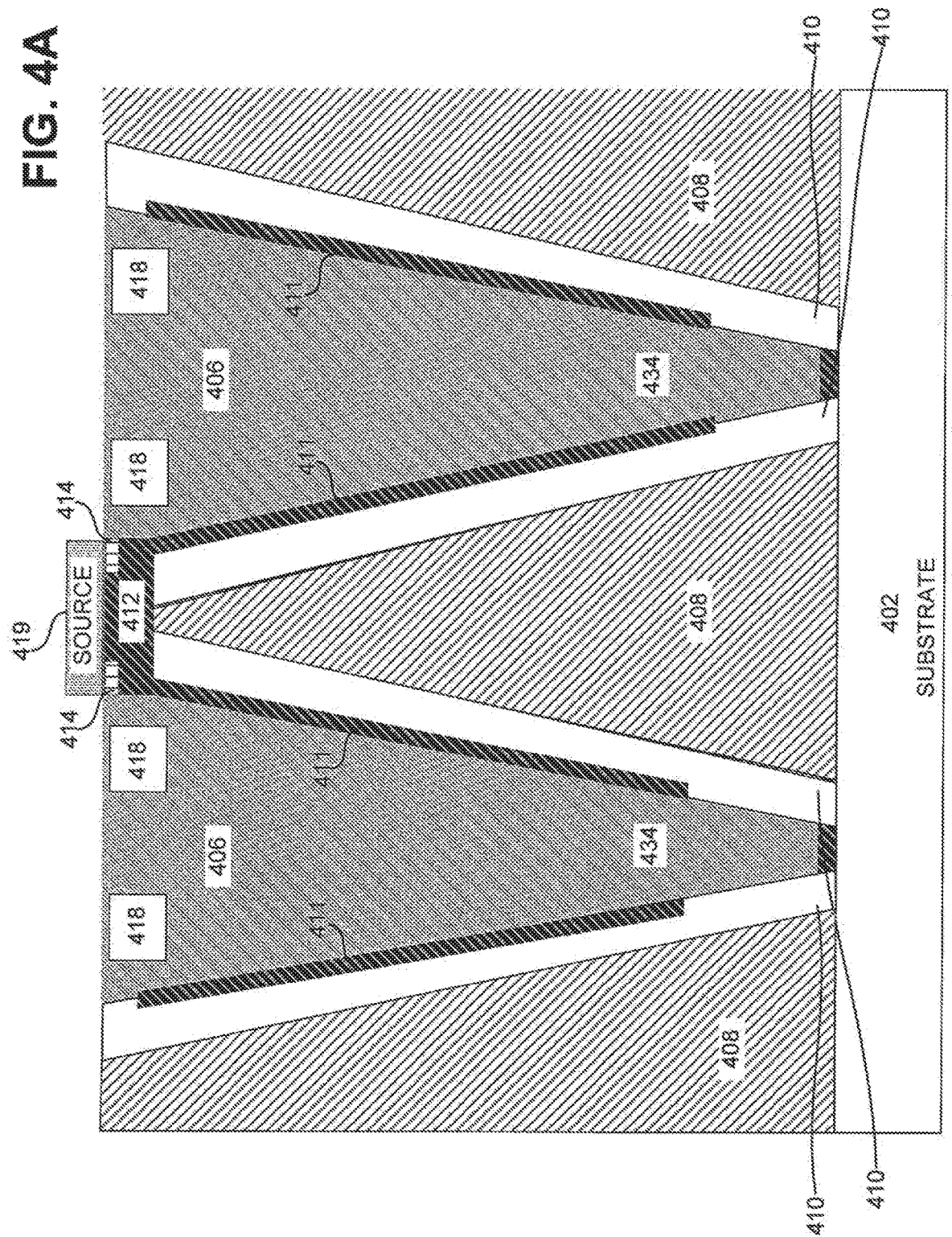

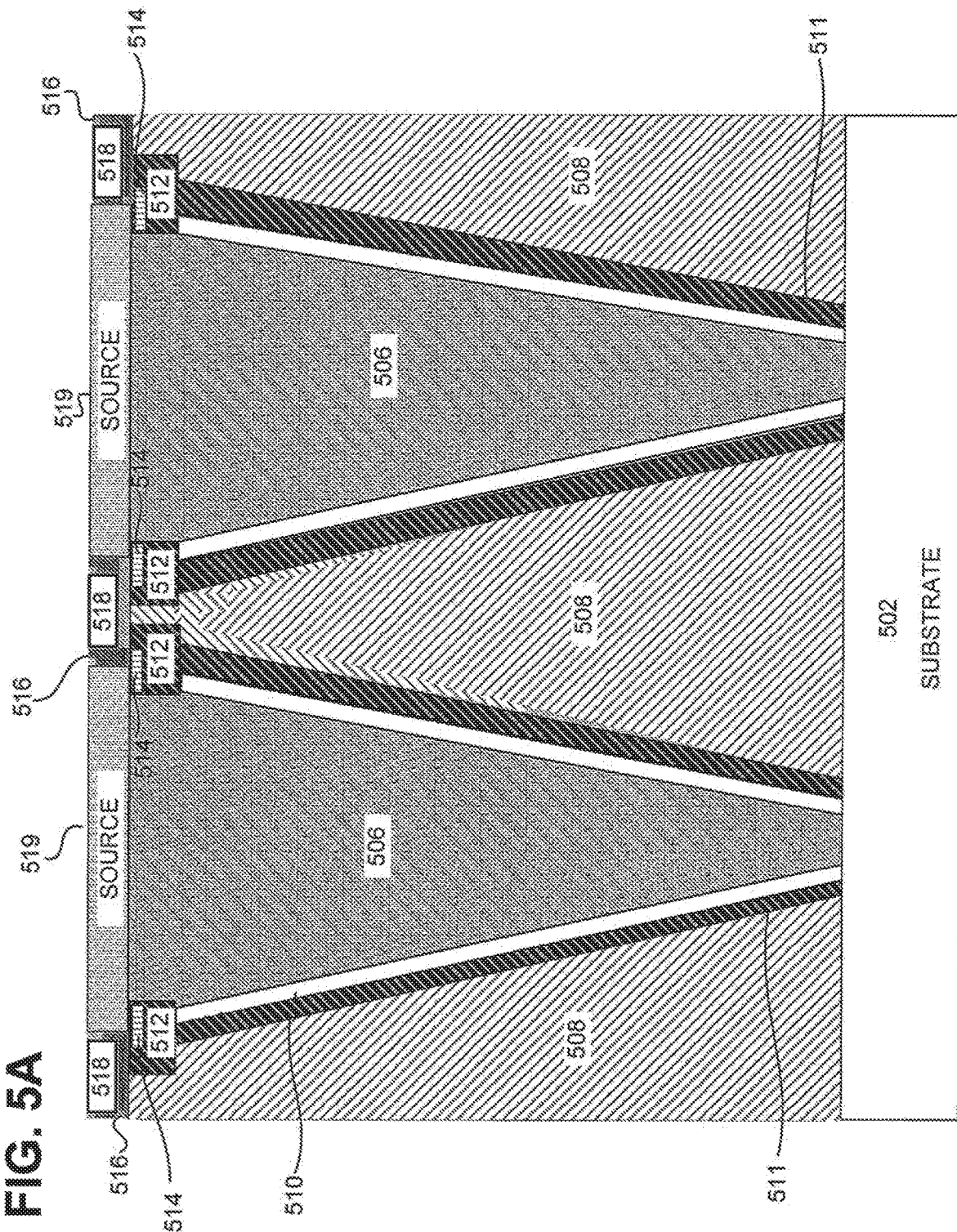

PROCESS AND STRUCTURE FOR A SUPERJUNCTION DEVICE

BACKGROUND INFORMATION

Field of the Disclosure

The present invention relates generally to semiconductor devices, devices structures, and processes for fabricating high-voltage integrated circuits or power transistors devices.

Background

High-voltage applications such as motor drives, uninterruptible power supplies, and solar inverters may use power semiconductor devices. A variety of power semiconductor devices are available depending on the specific requirements of the application, such as power diodes, power metal-oxide-semiconductor field-effect transistors (MOSFET), bipolar-junction transistors (BJT), insulated gate bipolar transistors (IGBT), thyristors, etc.

Performance metrics of power semiconductor devices may include operating current and voltage, input and output impedance, switching speed, reverse-bias breakdown voltage, etc. The type of power semiconductor device utilized may be based in part on these performance metrics. Additional factors such as cost and device area may also contribute to the determination of the type of power semiconductor device utilized.

In order to increase the breakdown voltage of the vertical device, the thickness of an epitaxial layer of the vertical device also increases and the doping concentration in epitaxial layer decreases. However, this leads to a disproportional increase in the drain-source resistance ($R_{DSON}$), which increases conduction losses when the vertical device is in the ON state. Another type of device known as a superjunction device can improve $R_{DSON}$ for devices with high breakdown voltage by using charge compensation. For the same conduction losses ($R_{DSON}$) superjunction devices require less area, which results in smaller output capacitance and smaller energy that is stored and lost during switching transitions.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIG. 3B illustrates a top view of the superjunction device of FIG. 3A, in accordance with embodiments of the present disclosure.

FIG. 4A illustrates another example of a superjunction device with a trench and an LIMOS gate, in accordance with embodiments of the present disclosure.

FIG. 5A illustrates a superjunction device with a trench and a DMOS gate, in accordance with embodiments of the present disclosure.

Figure 1:
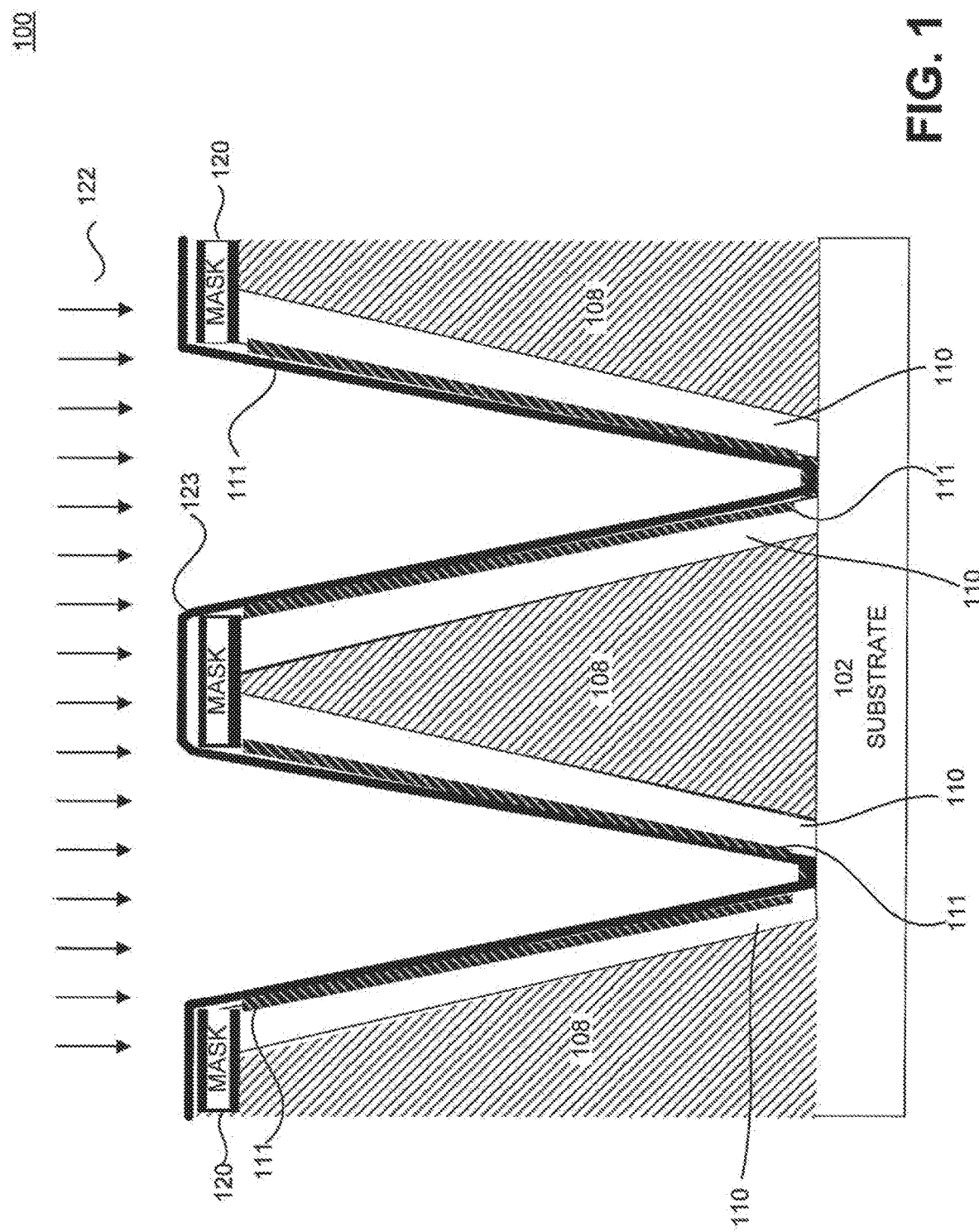
FIG. 1 illustrates one example of a process for forming superjunction device with a mask for implantation, in accordance with embodiments of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of a superjunction device with a trench are described herein. In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment," "an embodiment," "one example," or "an example" means that a particular feature, structure or characteristic described in connection with the embodiment or example is included in at least one embodiment of the present invention. Thus, appearances of the phrases "in one embodiment," "in an embodiment," "one example," or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

A superjunction device can provide a lower specific ON resistance ($R_{DSON}$) and lower output capacitance ($C_{OSS}$) performance in comparison to a vertical device with the same breakdown voltage. In one example, a vertical device can be a metal-oxide-semiconductor field effect transistor (MOSFET). The specific ON resistance is derived from the product's drain-source ON resistance and the area of the device. In one example, for a vertical device with a breakdown voltage of 400 volts, it can have an output capacitance of 360 picofarads (pf), an area of 13.8 mm^2 and a 0.2 Ohm resistance. The specific ON resistance is calculated to be 2.76 Ohm/mm^2.

The use of a superjunction device instead of a vertical device can provide numerous benefits. For a superjunction device with the same breakdown voltage as the vertical MOSFET mentioned above, the superjunction device can be built with less area, which in reduces the overall specific on resistance and decreases switching losses during each turn off event. In one example, the superjunction device can have an 8.0 mm$^2$ area and a 0.2 ohm resistance. The specific on resistance is calculated to be 1.6 ohm/mm$^2$, which is a decrease in specific on resistance by forty two percent in comparison to the planar vertical device.

The superjunction device in the present disclosure can be formed in vertical columns of a trench etched into a silicon surface. The formation of vertical columns includes substantially equal doping concentrations of adjacent P and N columns in order to achieve charge balancing. The positive charges from the P column and negative charges from the N column provide a net charge of zero in the drift region. The charge balancing provided by the P and N column is critical to creating a constant electric field in order to maximize the breakdown voltage of the superjunction device. A high doping concentration in N column allows reduction of specific Ron for the targeted breakdown voltage.

In addition, the trench can be filled with a semi-insulating material such as semi-insulating polycrystalline silicon (SI-POS) or another equivalent insulating material to create a high voltage resistance between the source and drain to further assist in charge balancing. The insulated resistor can help provide a constant electric field throughout the superjunction device because the vertical electric field in semi-insulating resistor is expected to be approximately constant.

Superjunction devices include trenches filled with oxide. In one example, a superjunction device can be built with U-shaped trenches. However the performance and reliability of the superjunction device is reduced when voids are formed in the trench caused by the uneven filling of the trench with oxide. The voids can adversely affect device reliability due to presence of mobile charges that can move in high electric fields during the OFF state. As described below, a superjunction vertical transistor device can be formed that reduces the formation of voids when filling the trench with oxide when the trench is V-shaped instead of U-shape.

FIG. 1 illustrates one example of a process for forming a superjunction device with a hard mask for implantation, in accordance with embodiments of the present disclosure. The superjunction device 100 comprises a substrate 102, a N-type epitaxial layer 108, a first type vertical column 110, a second type vertical column 111, a hard mask layer 120 for implantation, and optional screen oxide layer 123.

To form the superjunction device structure 100, an N-type substrate 102 can be used, on which an N-type epitaxial layer 108 is formed. Next, a hard mask layer 120 is formed over the epitaxial layer N-type layer. A trench is etched with a sloped angle in the N-type epitaxial layer 108. In one example, the angle of the trench can be between 85-95 degrees. The angle of the trench less than 90 degrees can be formed for a V-trench. With implantation 122 and diffusion, a first type vertical column 110 is formed adjacent to the trench. Similarly by implantation 122 and diffusion, a second type vertical column 111 is formed adjacent to the first vertical column 110. The first vertical column 110 can be a P-type semiconductor and the second vertical column 111 can be N-type semiconductor. It is appreciated in other examples, the first vertical column 110 can be an N-type semiconductor and the second vertical column 111 can be a P-type semiconductor. The implantation doses of the first vertical column and of the second vertical column are approximately equal to provide charge compensation. The implanting and diffusing can include boron and phosphate as part of the first type vertical column or the second type vertical column formation.

Figure 2:
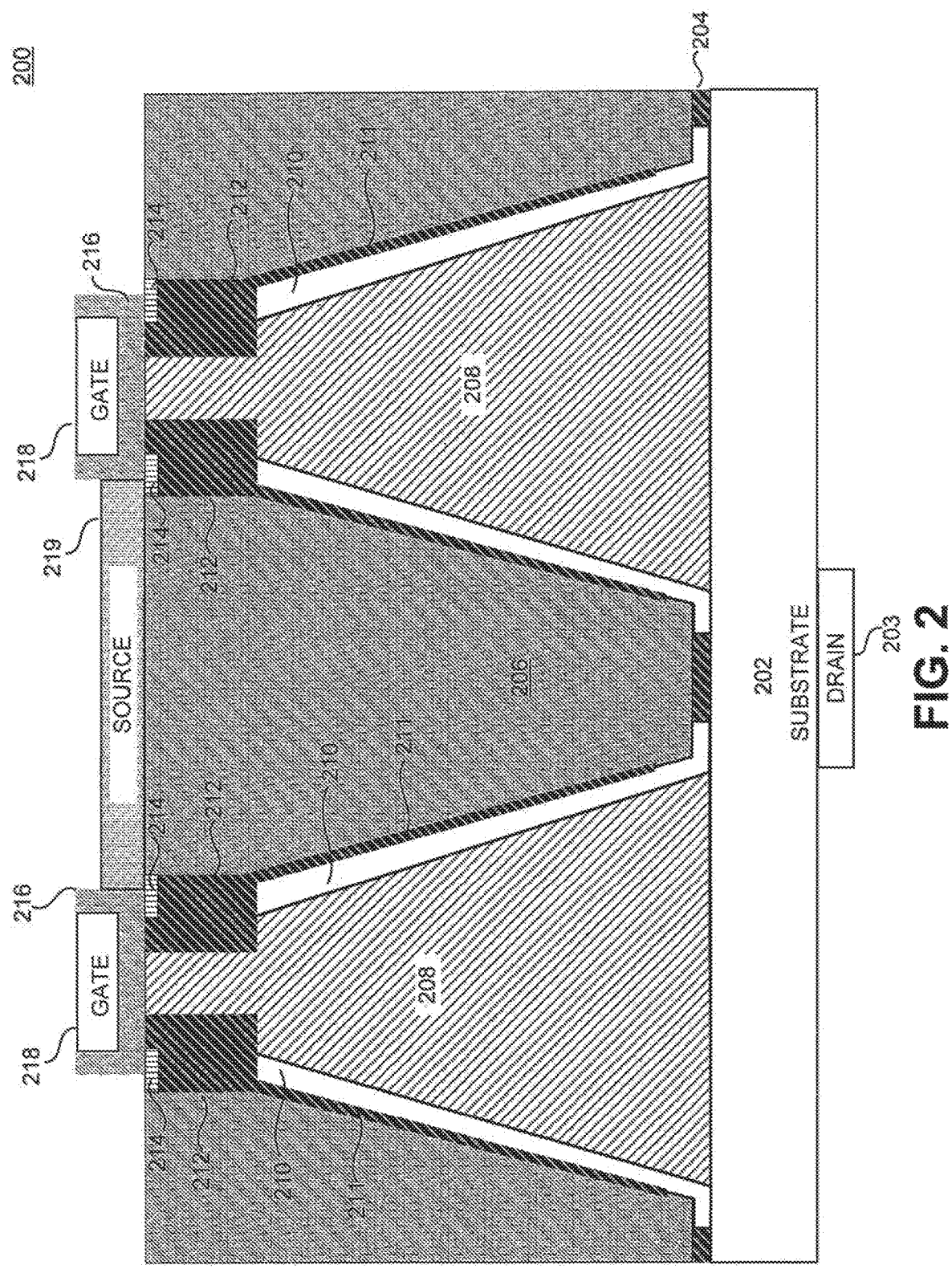
FIG. 2 illustrates one example of a superjunction device with a V-trench, in accordance with embodiments of the present disclosure.

FIG. 2 illustrates one example of a superjunction device with a V-trench, in accordance with embodiments of the present disclosure. It is appreciated that the elements mentioned in FIG. 2 may be one example of elements of FIG. 1, and that similarly named and numbered elements referenced below are coupled and function similar to as described above. The superjunction device 200 comprises a substrate layer 202, a P+ layer 204, an epitaxial layer 208, a first vertical column 210, a second vertical column 211, a source contact 214, a p-body region 212, a gate oxide 216, a gate contact 218, and source electrode 219. The substrate layer 202 can comprise of silicon material and is above the drain contact 203. The epitaxial layer is formed above the substrate layer 202. The P+ layer 204 is formed by P-type implantation to a bottom of the superjunction device 200 and is disposed above the epitaxial layer 208. As mentioned previously, the first vertical column 210 and the second vertical column 211 are formed through implantation and diffusion. A trench is formed and is filled with an insulating material 206. The insulating material 206 can use oxides such as tetrathoxysilane (TEOS), thermal oxide, borophosphosilicate glass (BPSG), nondoped silica glass (NSG). The angle of the trench can be between 85 to 95 degrees. In FIG. 2 the V-shape trench is preferred, which allows the insulating material to be filled without voids and allows the first vertical column 210 and the second vertical column 211 regions to be formed by vertical (zero degree) implantation. The P-body region 212 is coupled to the source contact 214. A gate oxide 216 is deposited above the epitaxial layer 208. The gate 218 is formed above the gate oxide. In other examples, the gate 218 can be formed within the trench. The source electrode 219 is formed above source contact 214. In addition, an insulation layer (not shown) can be formed above the gate 218.

Figure 3A:
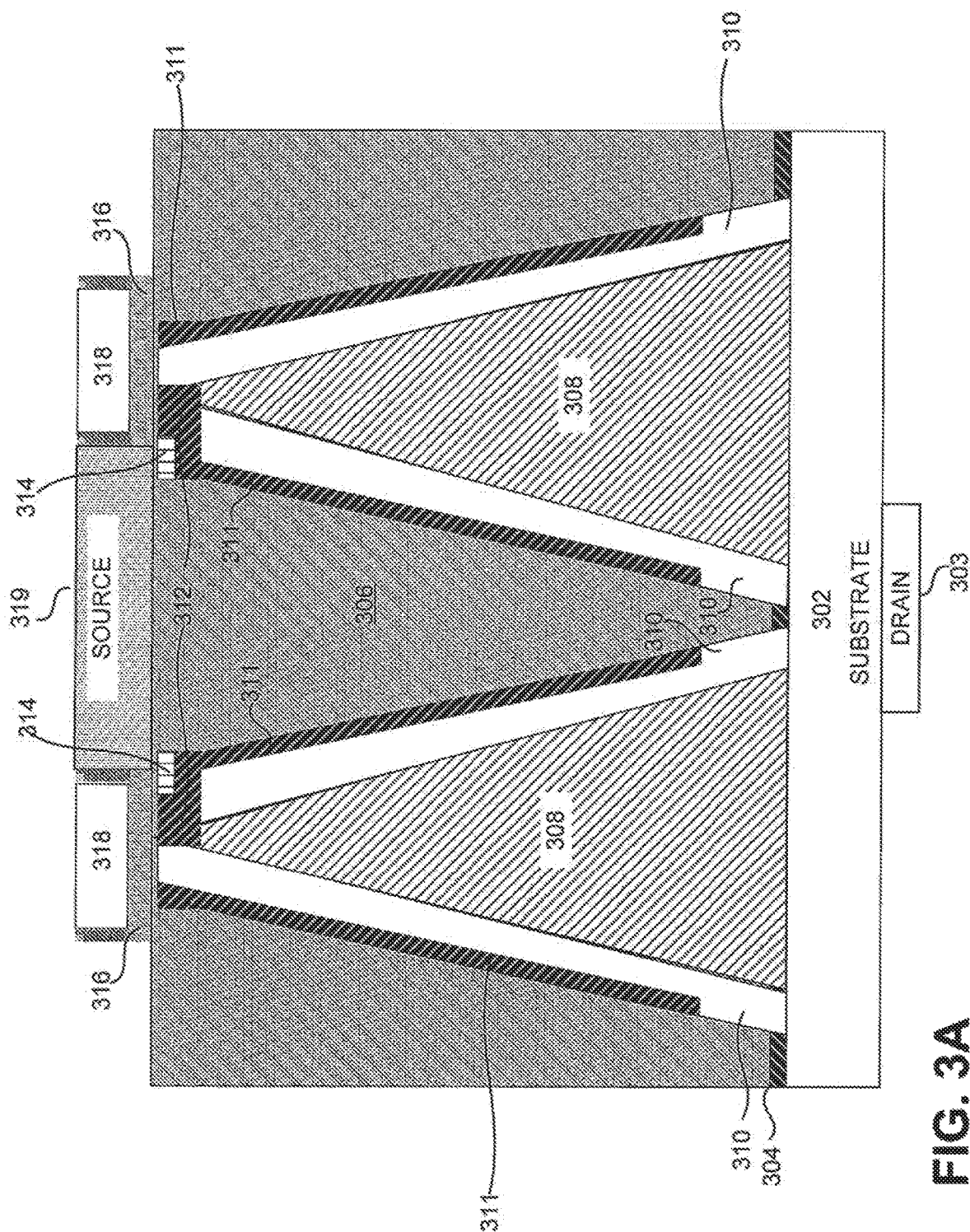
FIG. 3A illustrates another example of a superjunction device with a trench and a DMOS gate, in accordance with embodiments of the present disclosure.

FIG. 3A illustrates another example of a superjunction device with a trench and a DMOS gate, in accordance with embodiments of the present disclosure. It is appreciated that the elements mentioned in FIG. 3A may be one example of elements of the previous figures, and that similarly named and numbered elements referenced below are coupled and function similar to as described above. FIGS. 3A-6B represent several embodiments of the superjunction device that use the vertical trench to allow the filling of the insulating material without voids. The superjunction 300 comprises similar elements as the previous figures. The difference is the channel under the gate 318 couples source contact 314 and first vertical column 310.

FIG. 3B illustrates a top view of the superjunction device of FIG. 2 and FIG. 3A. The top view of the superjunction device shows the insulating material 306, epitaxial layer 308, second vertical column 311, P-body 312, N+ source 314, and gate 318. Channel under the gate 318 couples to N− epitaxial layer 308 (as shown on FIG. 2) and to N-type column (as shown on FIG. 3A)

FIG. 4A illustrates another example of a superjunction device with a trench and an UMOS gate, in accordance with embodiments of the present disclosure. It is appreciated that the elements mentioned in FIG. 4A may be one example of elements of the previous figures, and that similarly named and numbered elements referenced below are coupled and function similar to as described above. The superjunction device 400 comprises similar elements as the previous figures. The difference is the gate 418 is a UMOS gate.

Figure 4B:
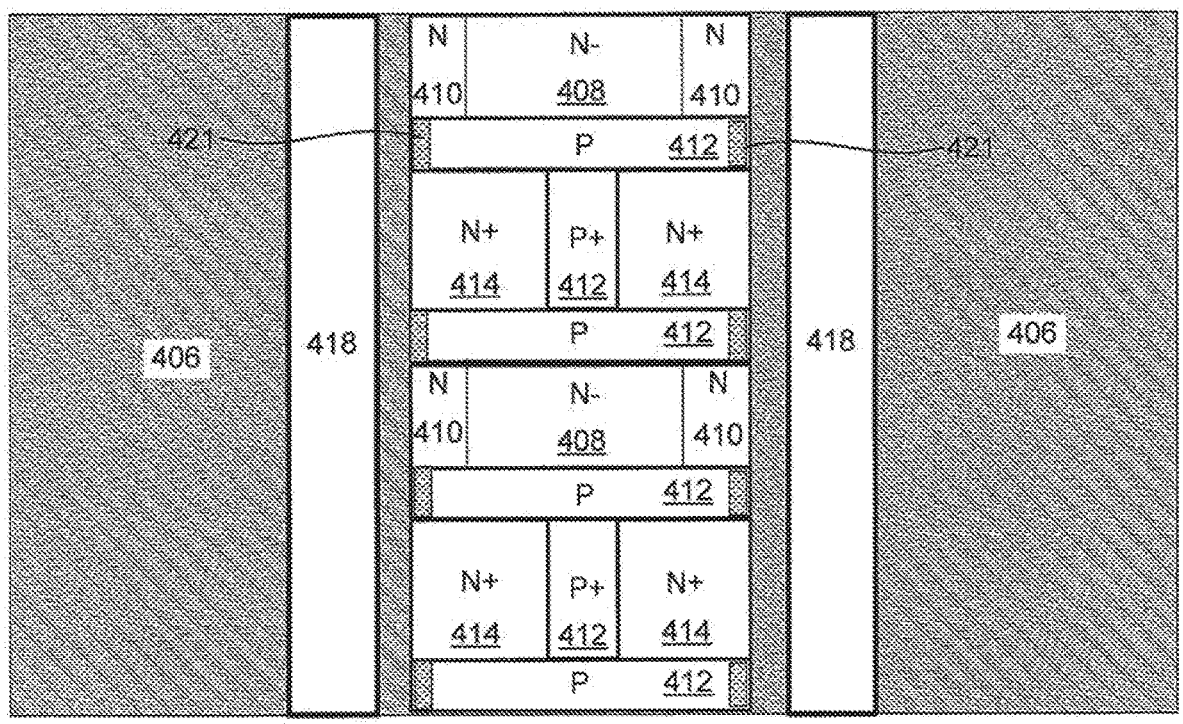
FIG. 4B illustrates a top view of the superjunction device in FIG. 4A, in accordance with embodiments of the present disclosure.

FIG. 4B illustrates a top view of the superjunction device of FIG. 4A. The top view of the superjunction device shows the insulating material 406, epitaxial layer 408, P-body 412, N+ source 414, and gate 418. Dash filled areas show the channel that couples source contact 414 to first vertical column 410.

Figure 4C:
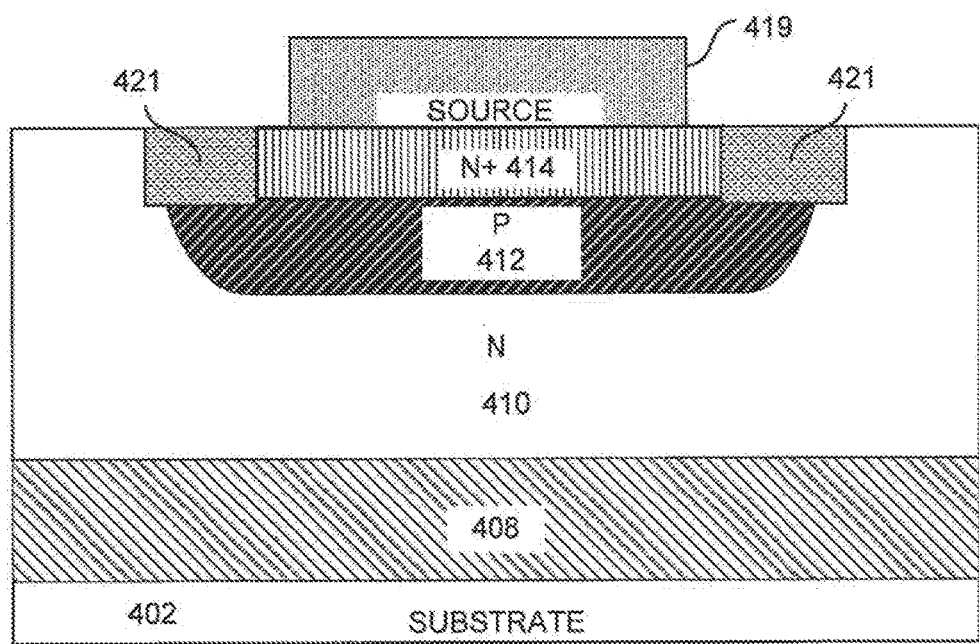
FIG. 4C illustrates a cross section through the channel of the superjunction device in FIG. 4A, in accordance with embodiments of the present disclosure.

FIG. 4C illustrates a cross section through the channel of the superjunction device in FIG. 4A. The cross section through the channel of the superjunction device shows how electrons traverses the superjunction device from the source 419 to the N+ source 414, then to first vertical column 410 (when a voltage is applied to the gate 418), and then to the substrate 402 and the drain.

Figure 5B:
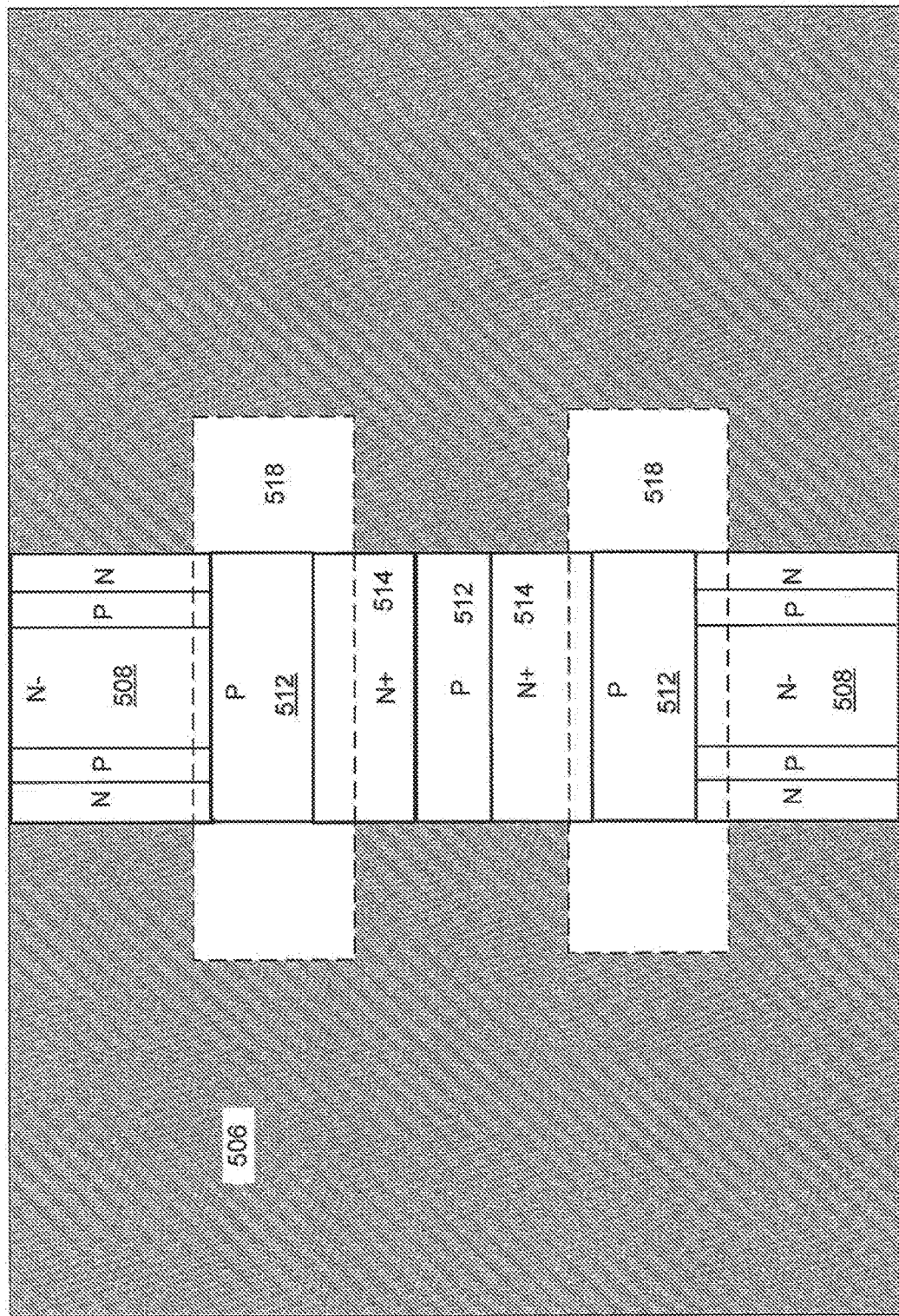
FIG. 5B illustrates a top view of the superjunction device in FIG. 5A, in accordance with embodiments of the present disclosure.

FIG. 5A illustrates a superjunction device with a trench and a DMOS gate, in accordance with embodiments of the present disclosure. It is appreciated that the elements illustrated in FIG. 5A may be one example of elements of the previous figures, and that similarly named and numbered elements referenced below are coupled and function similar to as described above. FIG. 5B illustrates a top view of the superjunction device in FIG. 5A, in accordance with embodiments of the present disclosure. It shows that channel under the gate 518 will couple the source contact 514 to the first vertical column 510.

Figure 6A:
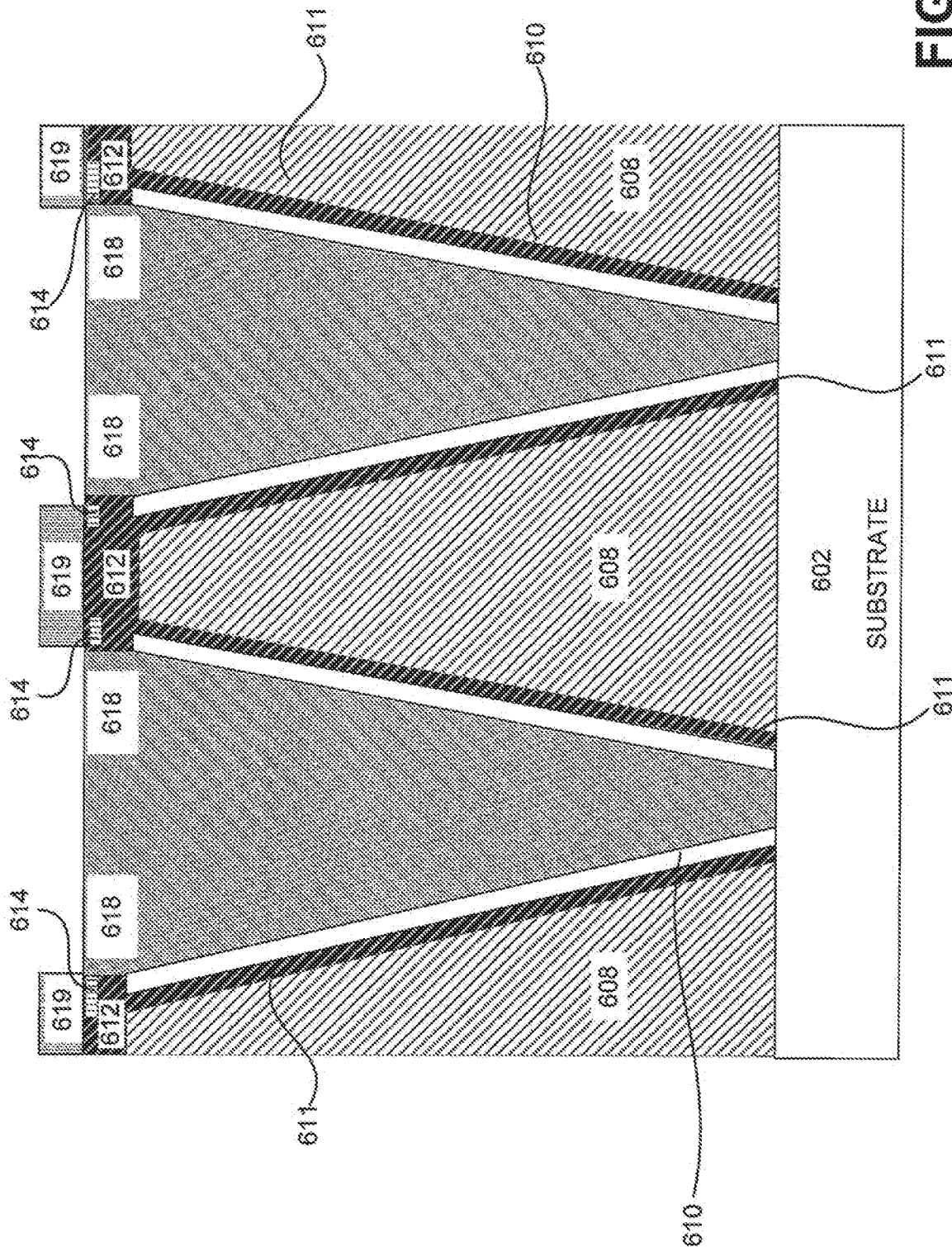
FIG. 6A illustrates another example of a superjunction device with a UMOS gate, in accordance with embodiments of the present disclosure.
Figure 6B:
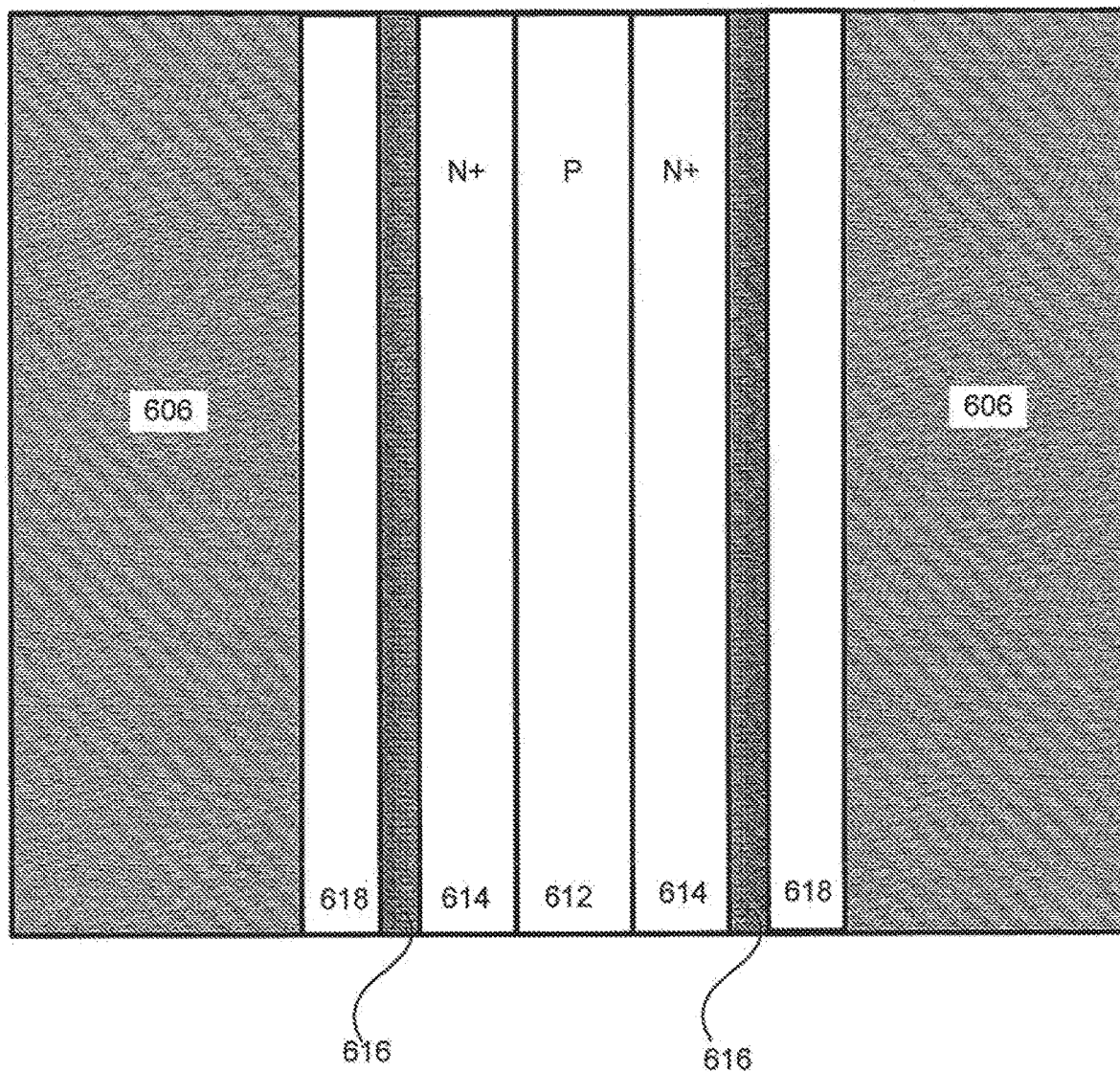
FIG. 6B illustrates a top view of the superjunction device in FIG. 6A, in accordance with embodiments of the present disclosure.

FIG. 6A illustrates another example of a superjunction device with a UMOS gate, in accordance with embodiments of the present disclosure. It is appreciated that the elements illustrated in FIG. 6A may be one example of elements of the previous figures, and that similarly named and numbered elements referenced below are coupled and function similar to as described above. FIG. 6B illustrates a top view of the superjunction device in FIG. 6A, in accordance with embodiments of the present disclosure.

Figure 7A:
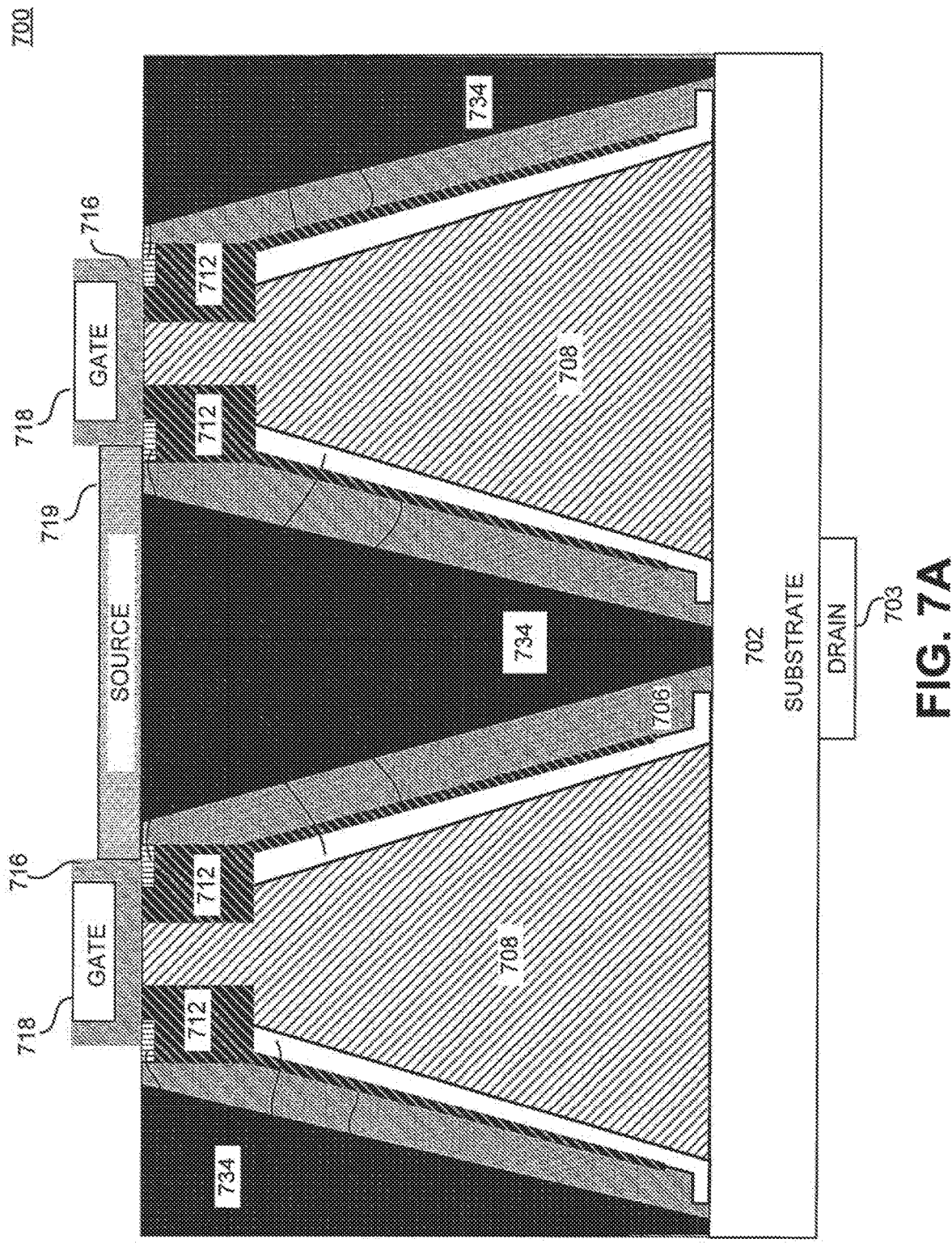
FIG. 7A illustrates another example of a superjunction device with an insulated resistor, in accordance with embodiments of the present disclosure.

FIG. 7A illustrates another example of a superjunction device with an insulated resistor, in accordance with embodiments of the present disclosure. It is appreciated that the elements illustrated in FIG. 7A may be one example of elements of the previous figures, and that similarly named and numbered elements referenced below are coupled and function similar to as described above. As mentioned previously, the vertical trench can be filled with a semi-insulating material 734 such as semi-insulating polycrystalline silicon (SIPOS) or another equivalent insulating material to create a high voltage resistance path between the source and drain to further assist in charge balancing. The superjunction device 700 comprises a substrate layer 702, an epitaxial layer 708, a first vertical column 710, a second vertical column 711, a source contact 714, a P-body region 712, a gate oxide 716, a gate contact 718, source electrode 719, and a semi-insulating material 734. The substrate layer 702 can comprise of silicon material and is above the drain contact 703. The semi-insulating material 734 can be deposited into the trench in order to provide a nearly constant electric field, and can be coupled to the bottom of the epitaxial layer 708, or the bottom of substrate layer 702. The semi-insulating material 734 functions as an insulated resistor can help provide a nearly constant electric field throughout the superjunction device because the electric field expected to be approximately constant within insulated resistor. An additional benefit is to provide higher tolerance to charge misbalance. The epitaxial layer 708 is formed above the substrate layer 702. As mentioned previously, the first vertical column 710 and the second vertical column 711 are formed through implantation and diffusion. A trench is filled with an insulating material 706. The insulating material 706 can use oxides such as tetrathoxysilane (TEOS), thermal oxide, borophosphosilicate glass (BPSG), nondoped silica glass (NSG). The angle of the trench can be between 85 to 95 degrees. In FIG. 7A, the trench is substantially a V-shape, which allows the insulating material to be filled without voids and allows the first vertical column 710 and the second vertical column 711 regions to be formed by vertical (zero degree) implantation. A source contact 714 is coupled to the first vertical column 710 and the second vertical column 711. The P-body region 712 is coupled to the source contact 714. A gate oxide 716 is formed above the source contact 714 and the epitaxial layer 708. The gate 718 is formed above the gate oxide. In other examples, the gate 718 can be formed within the trench. The source electrode 719 is formed above source contact 714. In addition, a passivation layer (not shown) can be formed above the gate 718.

Figure 7B:
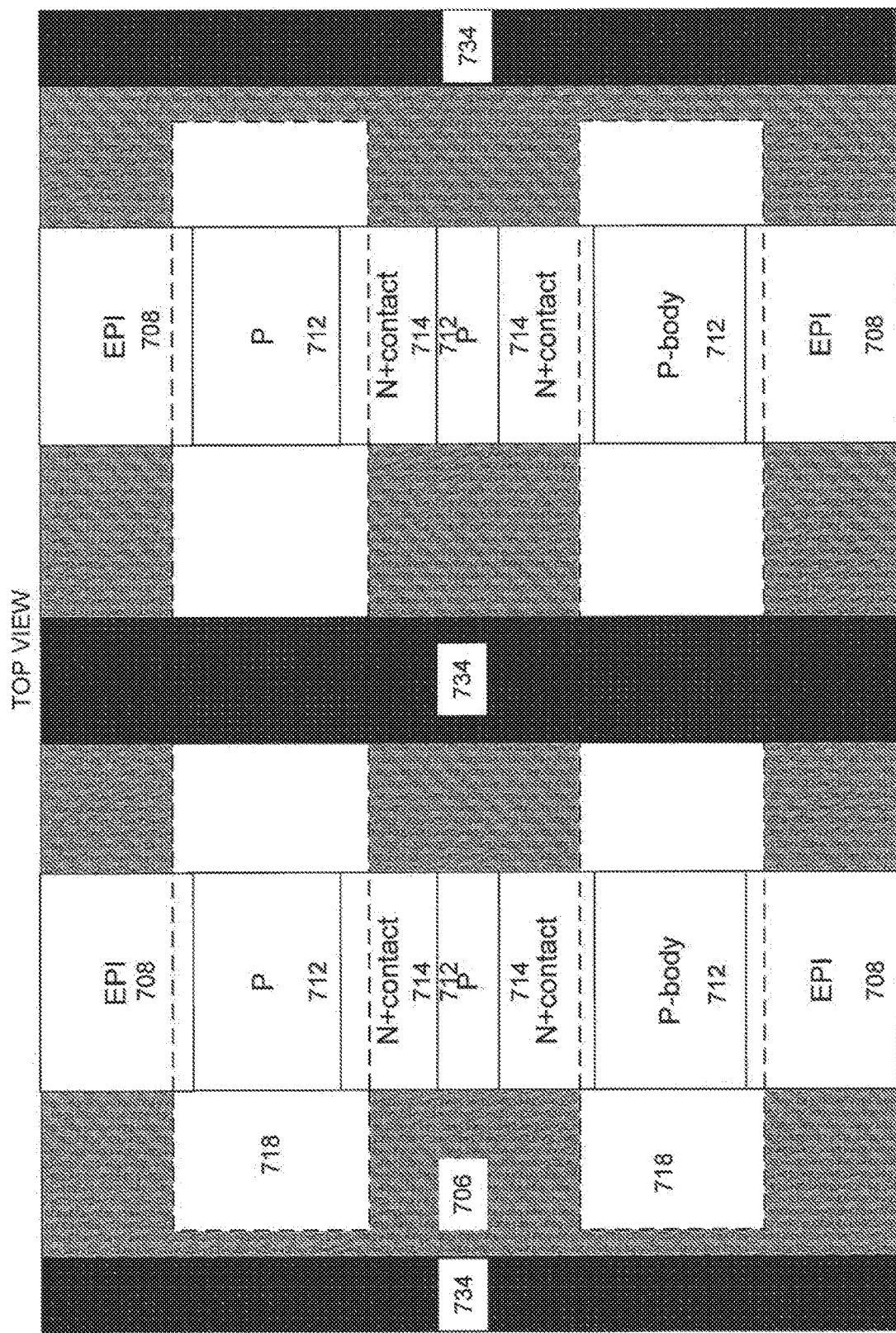
FIG. 7B illustrates a top view of the superjunction device in FIG. 7A, in accordance with embodiments of the present disclosure.

FIG. 7B illustrates a top view of the superjunction device of FIG. 7A. The top view of the superjunction device shows the insulating material 706, epitaxial layer 708, second vertical column 711, P-body region 712, N+ source 714, gate 718, and semi-insulating layer 734.

Figure 8A:
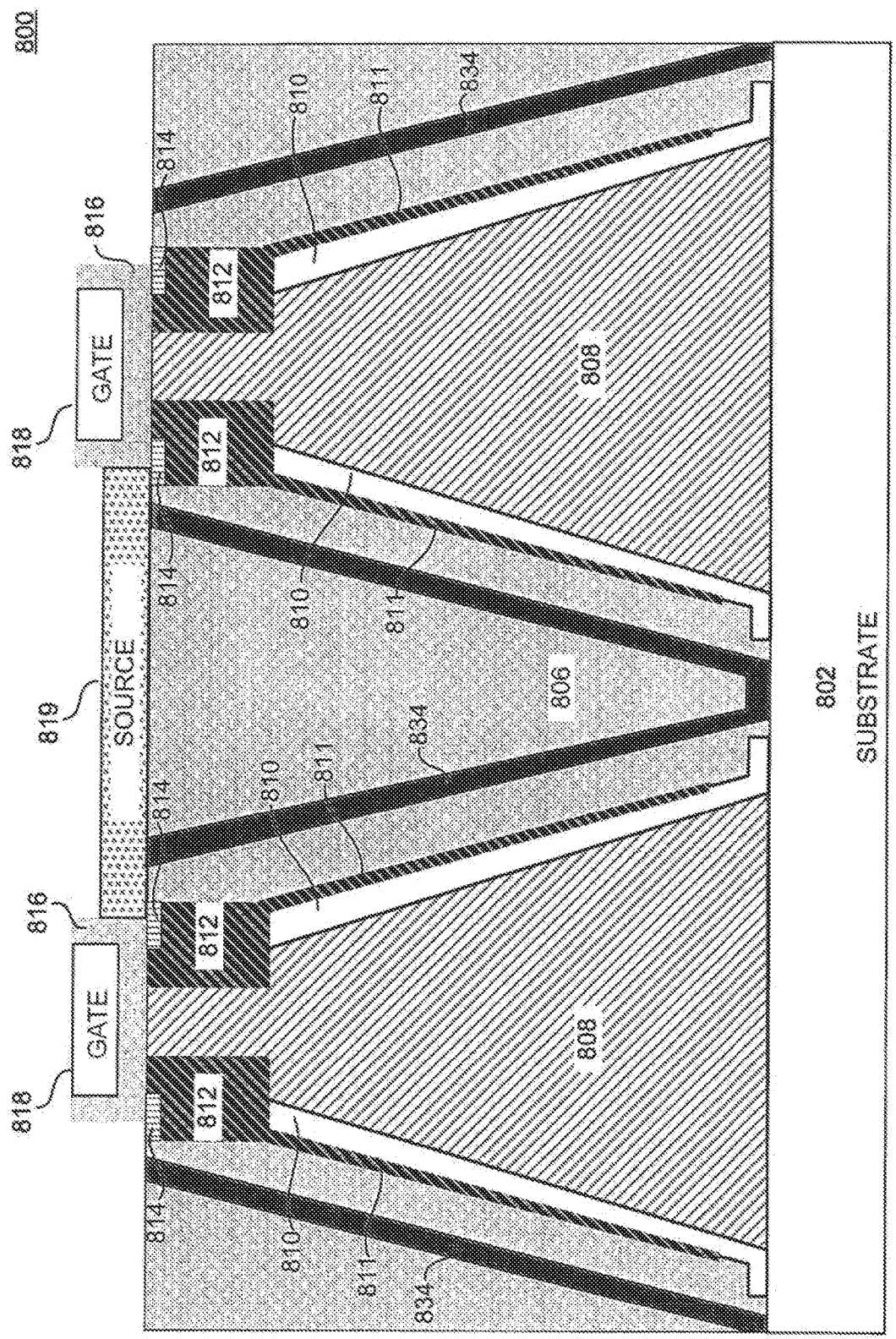
FIG. 8A illustrates another example of a superjunction device with a trench and a semi-insulating material, in accordance with embodiments of the present disclosure.

FIG. 8A illustrates another example of a superjunction device with a trench and a semi-insulating material, in accordance with embodiments of the present disclosure. It is appreciated that the elements mentioned in FIG. 8A may be one example of elements of the previous figures, and that similarly named and numbered elements referenced below are coupled and function similar to as described above. FIGS. 7A-12B represent several embodiments of the superjunction device that use the vertical trench to allow the filling of the insulating material without voids and further comprises the semi-insulating material. The superjunction device 800 comprises similar elements as the previous figures. The difference is semi-insulating material is in a V-shape.

Figure 8B:
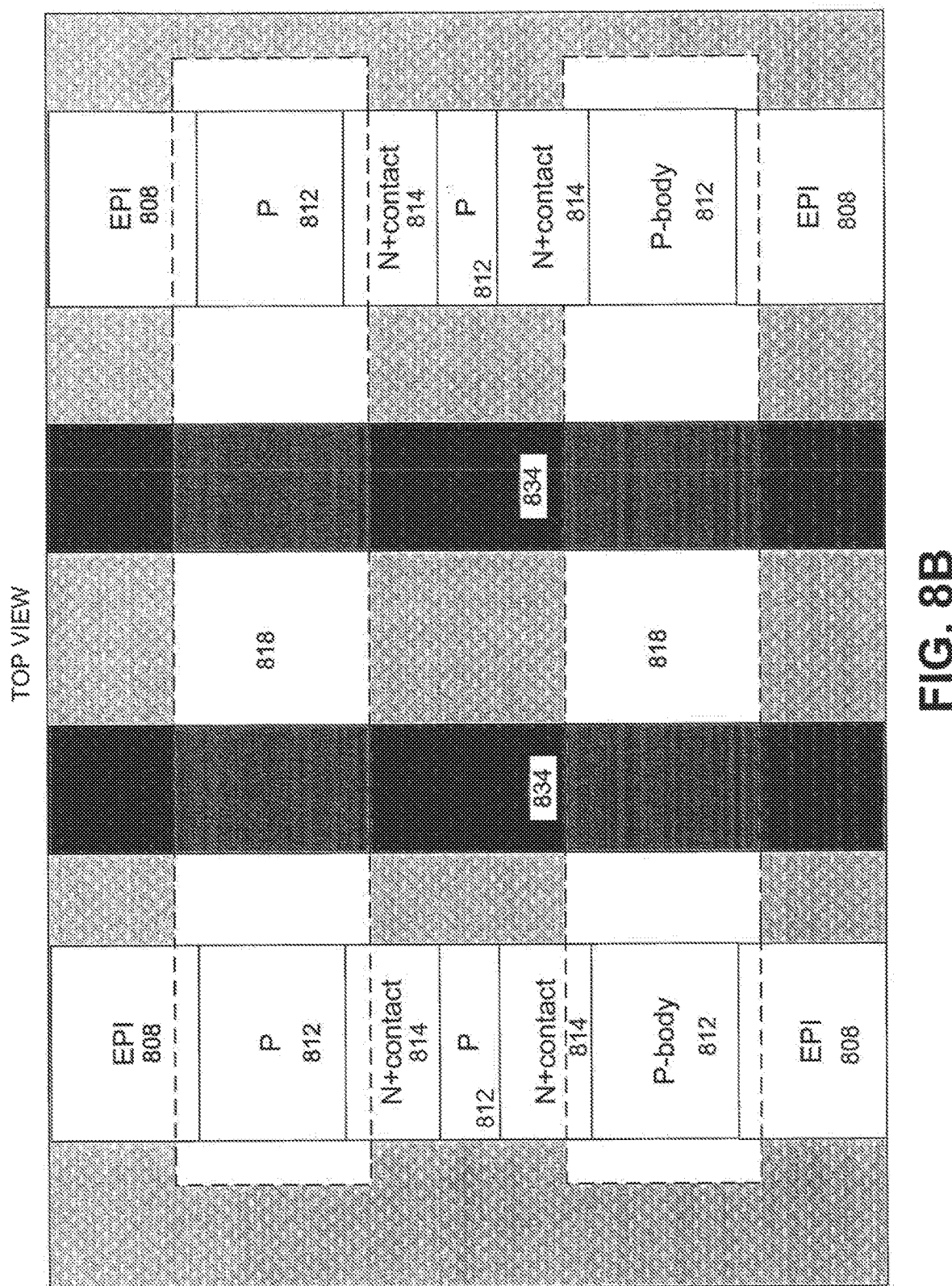
FIG. 8B illustrates a top view of the superjunction device in FIG. 8A, in accordance with embodiments of the present disclosure.

FIG. 8B illustrates a top view of the superjunction device of FIG. 8A. The top view of the superjunction device shows the insulating material 806, epitaxial layer 808, second vertical column 811, P-body region 812, N+ source 814, gate 818, and semi-insulating layer 834.

Figure 9A:
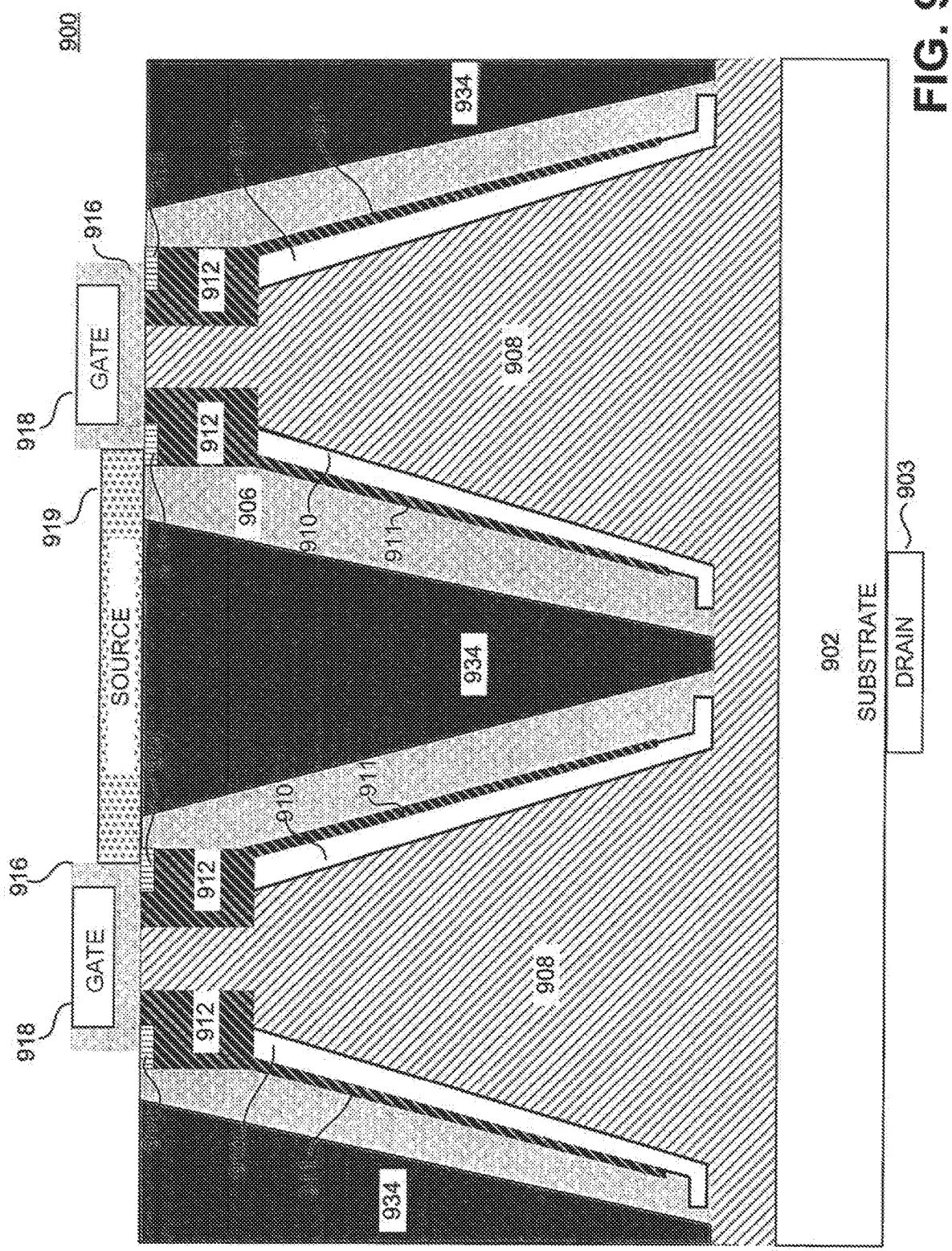
FIG. 9A illustrates another example of a superjunction device with a trench and a semi-insulating material, in accordance with embodiments of the present disclosure.

FIG. 9A illustrates another example of a superjunction device with a trench and a semi-insulating material, in accordance with embodiments of the present disclosure. It is appreciated that the elements mentioned in FIG. 9A may be one example of elements of the previous figures, and that similarly named and numbered elements referenced below are coupled and function similar to as described above. The superjunction device 900 comprises similar elements as the previous figures. The difference is semi-insulating material 934 is coupled to the epitaxial layer 908.

Figure 9B:
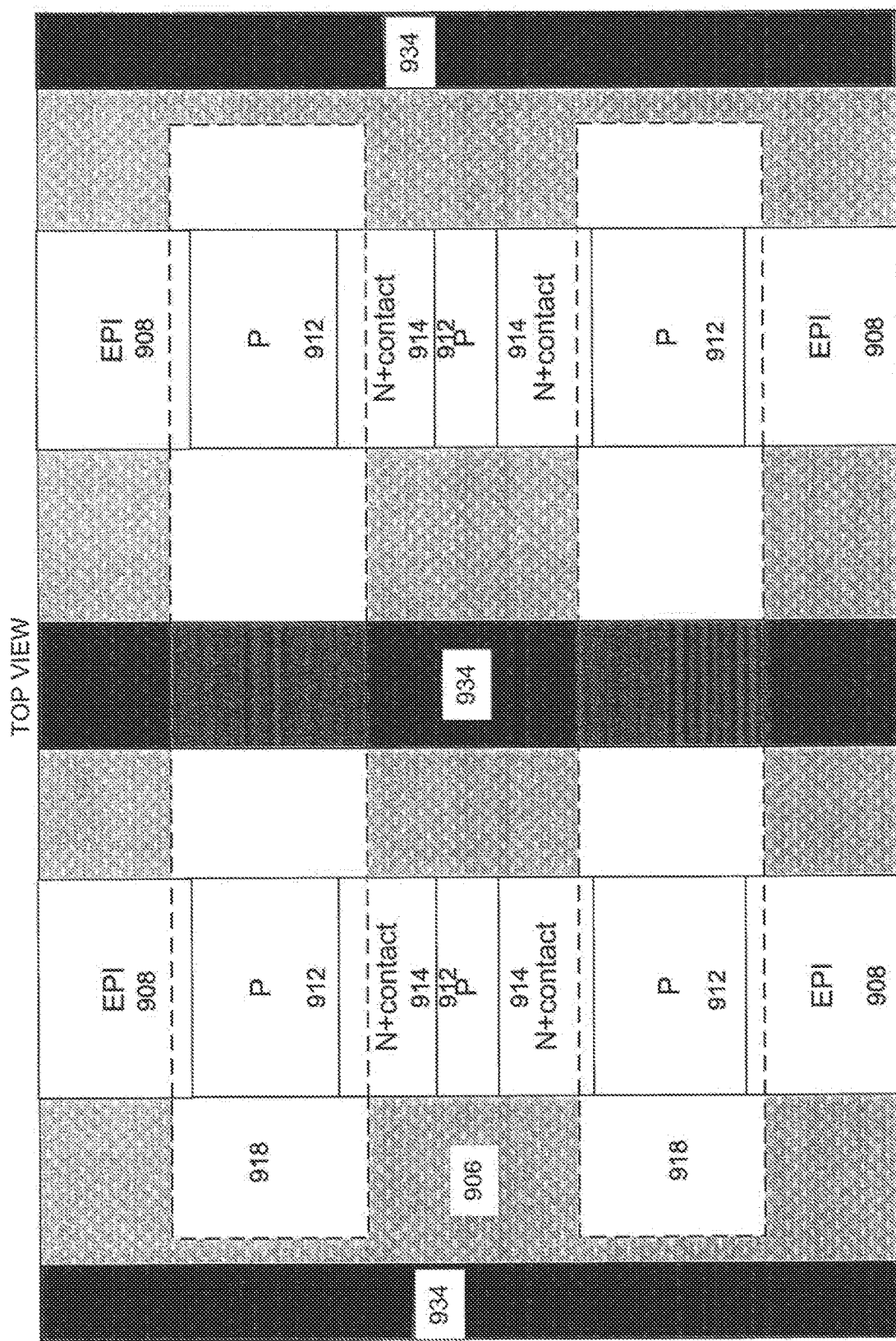
FIG. 9B illustrates a top view of the superjunction device in FIG. 9A, in accordance with embodiments of the present disclosure.

FIG. 9B illustrates a top view of the superjunction device of FIG. 9A. The top view of the superjunction device shows the insulating material 906, epitaxial layer 908, second vertical column 911, P-body region 912, N+ source 914, gate 918, and semi-insulating layer 934.

Figure 10A:
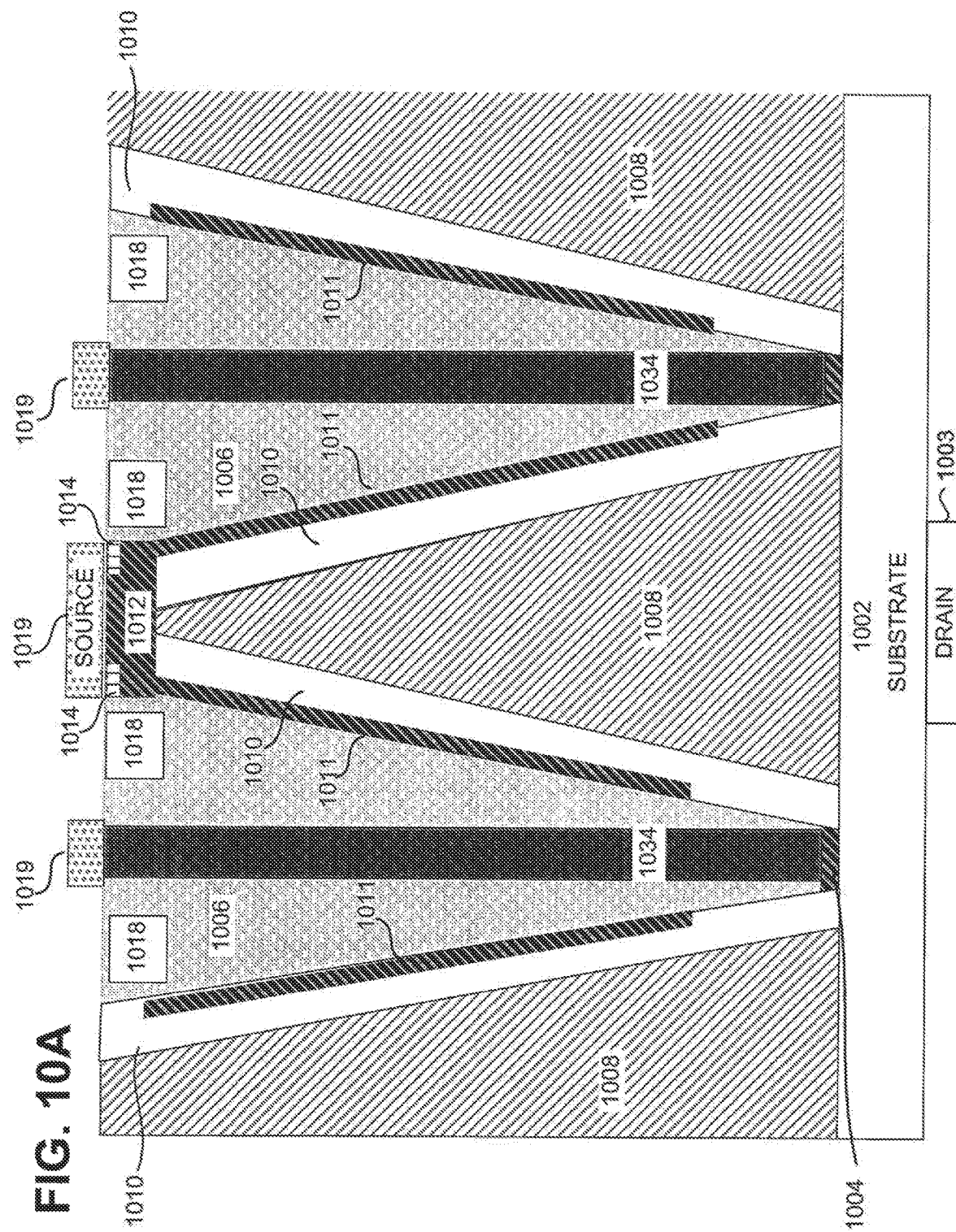
FIG. 10A illustrates another example of a superjunction device with a UMOS gate and a semi-insulating material, in accordance with embodiments of the present disclosure.

FIG. 10A illustrates another example of a superjunction device with a LIMOS gate and a semi-insulating material, in accordance with embodiments of the present disclosure. It is appreciated that the elements illustrated in FIG. 10A may be one example of elements of the previous figures, and that similarly named and numbered elements referenced below are coupled and function similar to as described above. The superjunction device 1000 comprises similar elements as the previous figures. The difference is semi-insulating material 1034 is coupled to the P+ layer 1004.

Figure 10B:
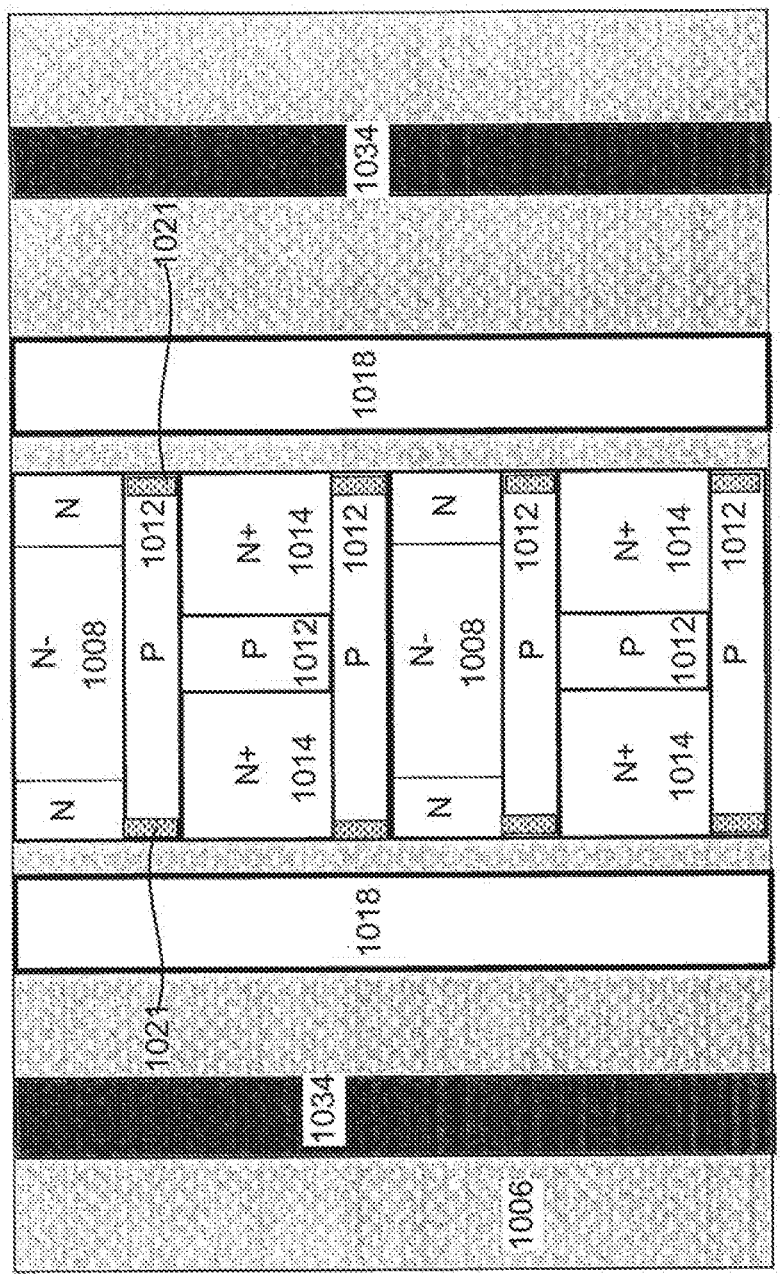
FIG. 10B illustrates a top view of the superjunction device in FIG. 10A, in accordance with embodiments of the present disclosure.

FIG. 10B illustrates top view of the superjunction device of FIG. 10A. The top view of the superjunction device shows the insulating material 1006, epitaxial layer 1008, second vertical column 1011, P-body region 1012, N+ source 1014, gate 1018, and semi-insulating layer 1034.

Figure 11A:
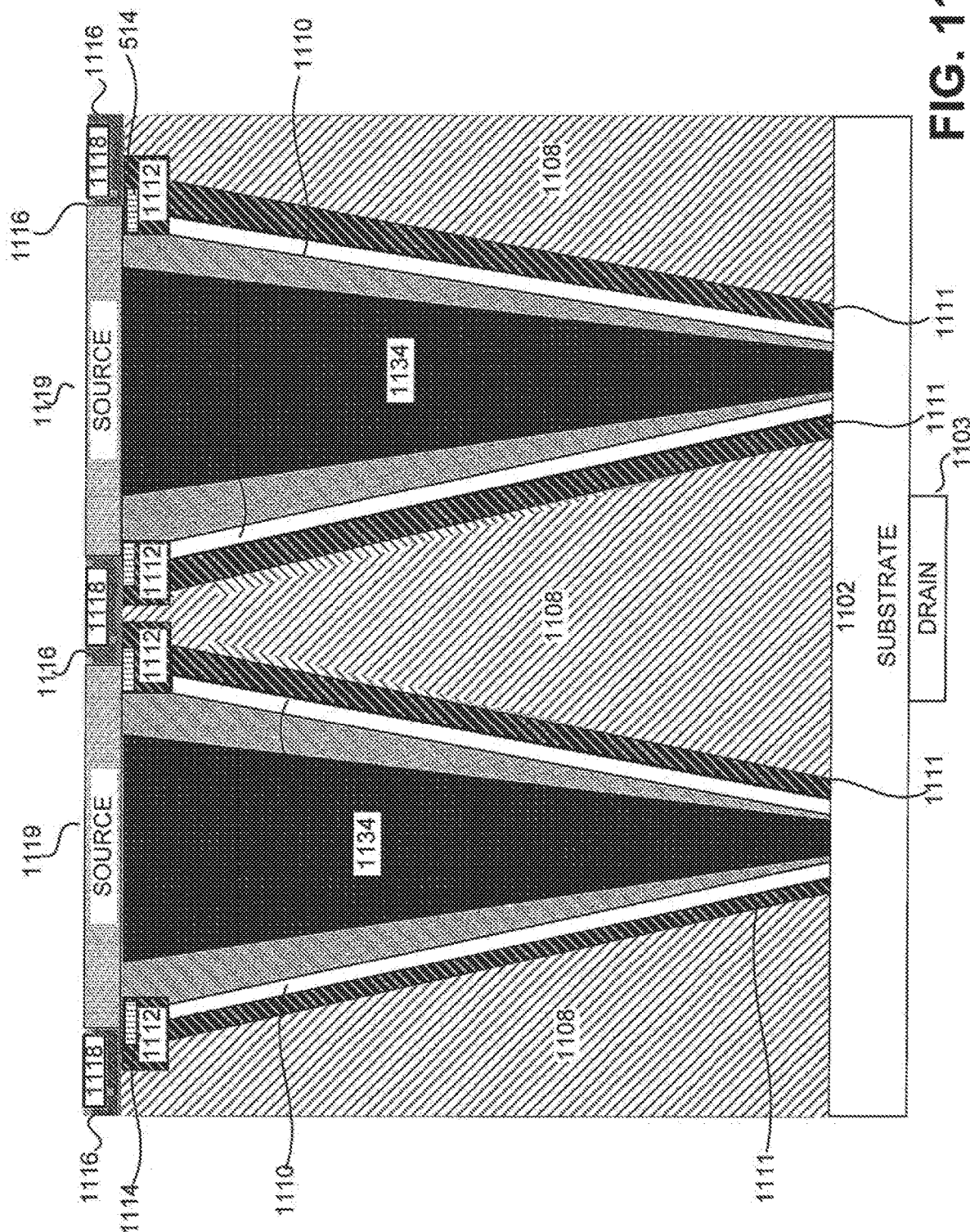
FIG. 11A illustrates a superjunction device with a trench and a DMOS gate, and a semi-insulating material, in accordance with embodiments of the present disclosure.
Figure 11B:
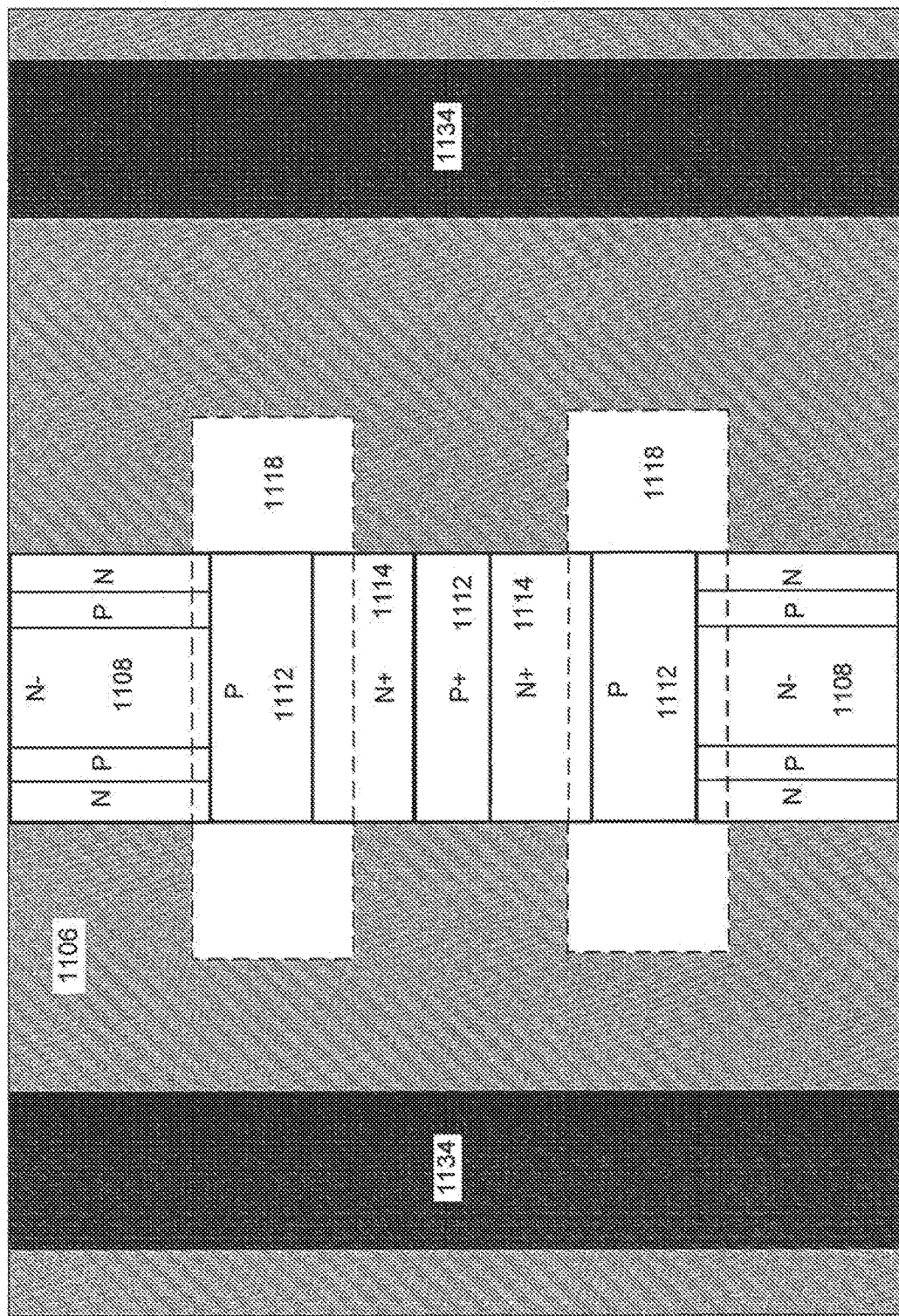
FIG. 11B illustrates a top view of the superjunction device in FIG. 11A, in accordance with embodiments of the present disclosure.

FIG. 11A illustrates a superjunction device with a trench and a DMOS gate, and a semi-insulating material, in accordance with embodiments of the present disclosure. It is appreciated that the elements illustrated in FIG. 11A may be one example of elements of the previous figures, and that similarly named and numbered elements referenced below are coupled and function similar to as described above.

Figure 12A:
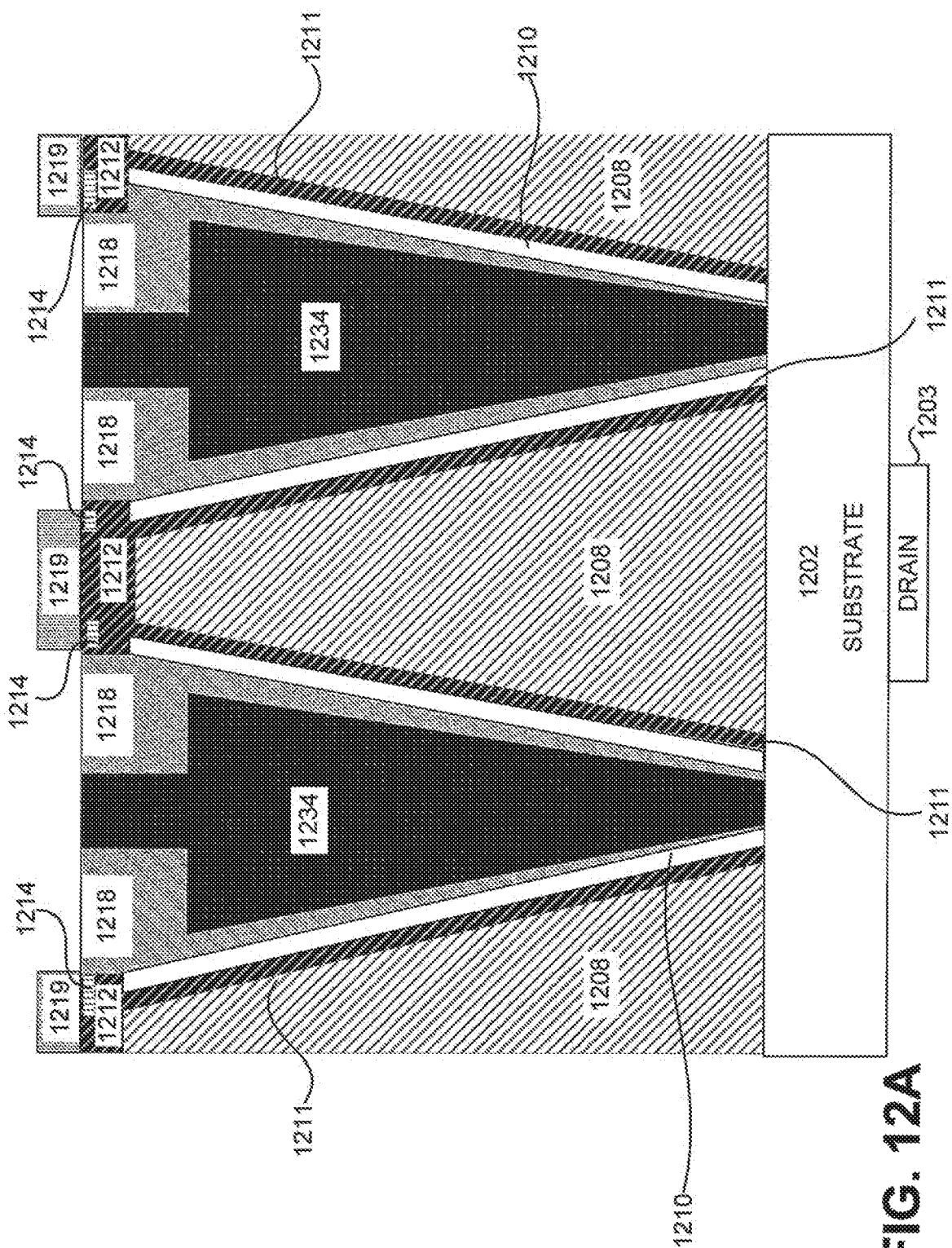
FIG. 12A illustrates another example of a superjunction device with a LIMOS gate, and a semi-insulating material in accordance with embodiments of the present disclosure.

FIG. 12A illustrates another example of a superjunction device with a LIMOS gate, and a semi-insulating material in accordance with embodiments of the present disclosure. It is appreciated that the elements illustrated in FIG. 12A may be one example of elements of the previous figures, and that similarly named and numbered elements referenced below are coupled and function similar to as described above.

Figure 12B:
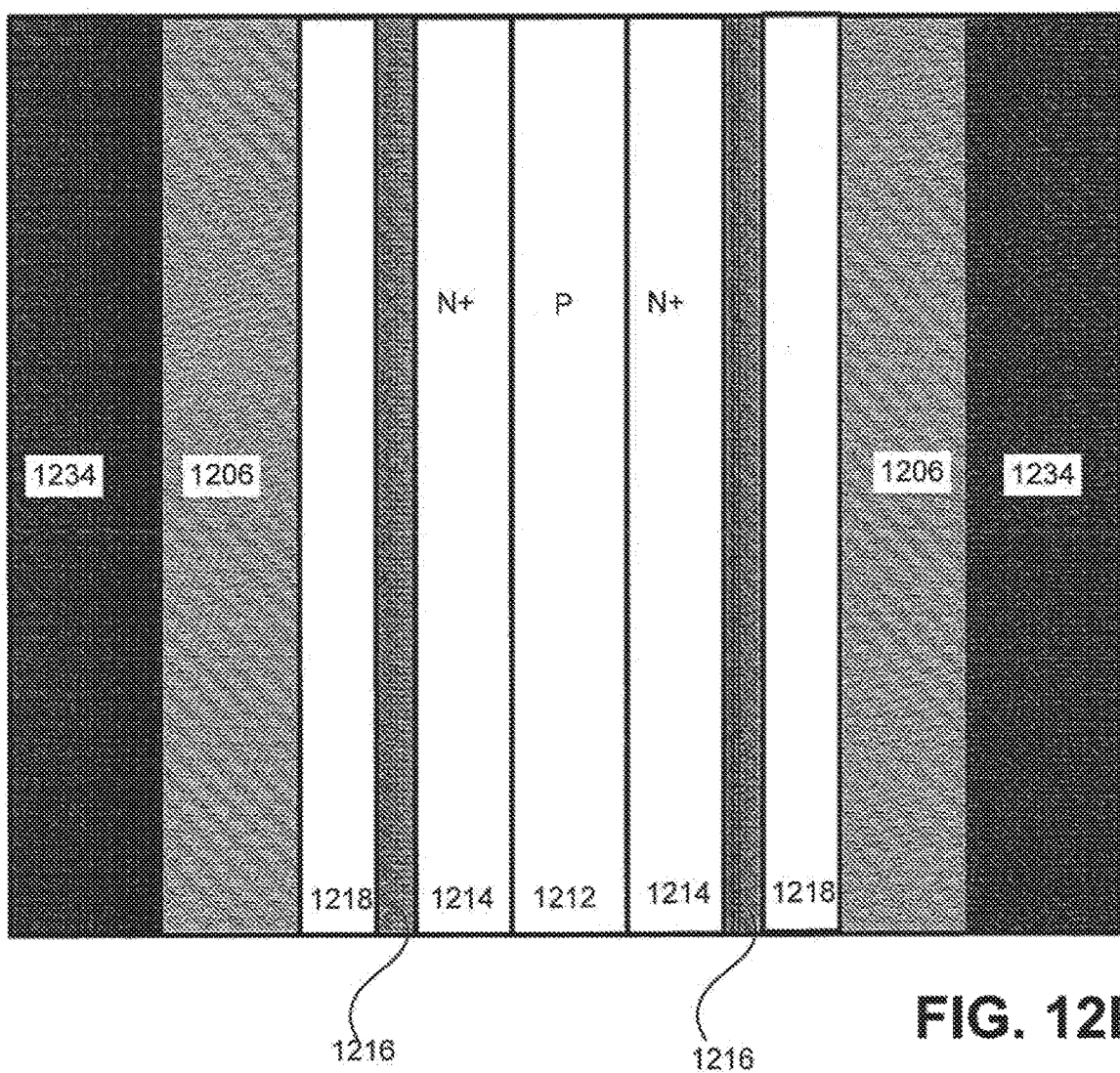
FIG. 12B illustrates a top view of the superjunction device in FIG. 12A, in accordance with embodiments of the present disclosure.

FIG. 12B illustrates a top view of the superjunction device in FIG. 12A, in accordance with embodiments of the present disclosure The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

Although the present invention is defined in the claims, it should be understood that the present invention can alternatively be defined in accordance with the following examples:

Example 1: A method of forming a superjunction device structure, comprising: depositing an epitaxial N-type layer over an N-type substrate; depositing a hard mask layer over the epitaxial N-type layer; etching a trench with a sloped angle on the epitaxial N-type layer; forming a first vertical column adjacent to the trench by implantation and diffusion; forming a second vertical column adjacent to the first vertical column by implantation and diffusion; filling the trench with an insulating material such that a formation of key-holes is avoided; performing a chemical-mechanical planarization (CMP) to remove the insulating material over the first and second vertical column and the epitaxial N-type layer; depositing a gate oxide and a polysilicon layer; etching the gate oxide and the polysilicon layer with a gate mask above the polysilicon layer to form a gate; implanting a source contact below the gate oxide; implanting a P-body region below the source contact; forming a source electrode and a gate contacts; and forming a drain contact below the N-type substrate.

Example 2: The method of example 1, further comprising: depositing a semi-insulating material into the trench to provide a near constant electric field.

Example 3: The method of any of the previous examples, further comprising etching the trench to an angle between 85 to 95 degrees.

Example 4: The method of any of the previous examples, wherein the first vertical column is a P-type semiconductor and the second vertical column is an N-type semiconductor.

Example 5: The method of any of the previous examples, wherein implantation doses of the first vertical column and of the second vertical column are approximately equal.

Example 6: The method of any of the previous examples, wherein implantation doses of the first vertical column and of the second vertical column are approximately equal.

Example 7: The method of any of the previous examples, further comprising implanting and diffusing a phosphate as part of the first vertical column or the second vertical column.

Example 8: The method of any of the previous examples, further comprising depositing a channel mask and implanting in a top portion of the p-body region to adjust a threshold voltage.

Example 9: A superjunction device, comprising: a drain contact; a substrate layer above the drain contact; an epitaxial layer above the substrate layer; a P+ layer above the epitaxial layer formed by P-type implantation to a bottom of the superjunction device; a trench with a sloped angle formed by use of a hard mask layer, the trench filled with an insulating material; a first vertical column formed adjacent to the trench, a second vertical column formed adjacent to the first vertical column; a source contact coupled to the first vertical column and the second vertical column; a P-body region coupled to the source contact; a gate oxide formed above the source contact and the epitaxial layer; and a gate formed above the gate oxide.

Example 10: The superjunction device of example 9, wherein the trench extends to the substrate layer.

Example 11: The superjunction device of any of the previous examples, further comprising a semi-insulating material deposited into the trench, the semi-insulating material coupled to the source contact at a top of the epitaxial layer or to the substrate layer.

Example 12: The superjunction device of any of the previous examples, wherein the semi-insulating material forms a u-shape in the trench, the semi-insulating material coupled to the source contact at the top of the epitaxial layer or to the substrate layer.

Example 13: The superjunction device of any of the previous examples, further comprising an epitaxial buffer layer formed between the substrate layer and a bottom of the trench.

Example 14: The superjunction device of any of the previous examples, wherein the first vertical column is a P-type semiconductor and the second vertical column is an N-type semiconductor Example 15: The superjunction device of any of the previous examples, wherein the first vertical column is an N-type semiconductor and the second vertical column is a P-type semiconductor.

Example 16: The superjunction device of any of the previous examples, wherein the gate is a DMOS gate.

Example 17: The superjunction device of any of the previous examples, wherein the gate is a LIMOS gate.

Example 18: The superjunction device of any of the previous examples, wherein the sloped angle of the trench is between 85 to 95 degrees.

Example 19: The superjunction device of any of the previous examples, further comprising: a passivation layer formed above the gate.

Example 20: The superjunction device of any of the previous examples, wherein the gate is formed within the trench.

Example 21: The superjunction device of any of the previous examples, wherein the trench is V-shaped to allow the trench to be filled with oxide without voids and to allow two column regions to be formed by vertical substantially zero degree implantation.

What is claimed is:

1. A method of forming a superjunction device structure, comprising:
   depositing an epitaxial N-type layer over an N-type substrate;
   depositing a hard mask layer over the epitaxial N-type layer;
   etching a trench with a sloped angle on the epitaxial N-type layer;
   forming a first vertical column adjacent to the trench by implantation and diffusion;
   forming a second vertical column adjacent to the first vertical column by implantation and diffusion;
   filling the trench with an insulating material such that a formation of key-holes is avoided;
   performing a chemical-mechanical planarization (CMP) to remove the insulating material over the first and second vertical column and the epitaxial N-type layer;
   depositing a gate oxide and a polysilicon layer;
   etching the gate oxide and the polysilicon layer with a gate mask above the polysilicon layer to form a gate;
   implanting a source contact below the gate oxide;
   implanting a P-body region below the source contact;
   forming a source electrode and a gate contacts; and
   forming a drain contact below the N-type substrate.

2. The method of claim 1, further comprising:
   depositing a semi-insulating material into the trench to provide a near constant electric field.

3. The method of claim 1, further comprising etching the trench to an angle between 85 to 95 degrees.

4. The method of claim 1, wherein the first vertical column is a P-type semiconductor and the second vertical column is an N-type semiconductor.

5. The method of claim 4, wherein implantation doses of the first vertical column and of the second vertical column are approximately equal.

6. The method of claim 1, further comprising implanting and diffusing boron as part of the first vertical column or the second vertical column.

7. The method of claim 1, further comprising implanting and diffusing a phosphate as part of the first vertical column or the second vertical column.

8. The method of claim 1, further comprising depositing a channel mask and implanting in a top portion of the p-body region to adjust a threshold voltage.

9. A superjunction device, comprising:
   a drain contact;
   a substrate layer above the drain contact;
   an epitaxial layer above the substrate layer;
   a P+ layer above the epitaxial layer formed by P-type implantation to a bottom of the superjunction device;
   a trench with a sloped angle formed by use of a hard mask layer, the trench filled with an insulating material;
   a first vertical column formed adjacent to the trench,
   a second vertical column formed adjacent to the first vertical column;
   a source contact coupled to the first vertical column and the second vertical column;
   a P-body region coupled to the source contact;
   a gate oxide formed above the source contact and the epitaxial layer; and
   a gate formed above the gate oxide.

10. The superjunction device of claim 9, wherein the trench extends to the substrate layer.

11. The superjunction device of claim 10, further comprising a semi-insulating material deposited into the trench, the semi-insulating material coupled to the source contact at a top of the epitaxial layer or to the substrate layer.

12. The superjunction device of claim 11, wherein the semi-insulating material forms a u-shape in the trench, the semi-insulating material coupled to the source contact at the top of the epitaxial layer or to the substrate layer.

13. The superjunction device of claim 11, further comprising an epitaxial buffer layer formed between the substrate layer and a bottom of the trench.

14. The superjunction device of claim 9, wherein the first vertical column is a P-type semiconductor and the second vertical column is an N-type semiconductor.

15. The superjunction device of claim 9, wherein the first vertical column is an N-type semiconductor and the second vertical column is a P-type semiconductor.

16. The superjunction device of claim 9, wherein the gate is a DMOS gate.

17. The superjunction device of claim 9, wherein the gate is a LIMOS gate.

18. The superjunction device of claim 9, wherein the sloped angle of the trench is between 85 to 95 degrees.

19. The superjunction device of claim 9, further comprising: a passivation layer formed above the gate.

20. The superjunction device of claim 17, wherein the gate is formed within the trench.

21. The superjunction device of claim 9, wherein the trench is V-shaped to allow the trench to be filled with oxide without voids and to allow two column regions to be formed by vertical substantially zero degree implantation.

\* \* \* \* \*